United States Patent
Tagami et al.

(10) Patent No.: US 6,215,368 B1
(45) Date of Patent: Apr. 10, 2001

(54) VOLTAGE CONTROLLED OSCILLATING DEVICE

(75) Inventors: Hitoyuki Tagami; Kuniaki Motoshima, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/337,730

(22) Filed: Jun. 22, 1999

(30) Foreign Application Priority Data

Feb. 22, 1999 (JP) .................................................. 11-042991

(51) Int. Cl.[7] ........................................................ H03B 5/12
(52) U.S. Cl. .................... 331/108 B; 331/57; 331/177 R; 327/261; 327/264; 327/266; 327/270
(58) Field of Search ..................................... 327/264, 266, 327/270, 261; 331/57, 177 R, 108 B

(56) References Cited

PUBLICATIONS

John McNeill, et al, IEEE International Symposium Circuites and Systems, May 1994, vol. 3, pp. 49–52.

*Primary Examiner*—Arnold Kinkead

(57) ABSTRACT

Voltage controlling/oscillating device comprises a terminal for setting the delay rate in the delay unit and the delay interpolator. Clock signal whose phase is inverted by the inverting gate is inputted into a first input terminal of the delay interpolator and into the delay unit. The delay unit delays the signal by d1 and inputs into second input terminal of the delay interpolator. Oscillation frequency control voltage is fed into a terminal of the delay interpolator through an oscillation frequency control terminal of the device. Delay control voltage is fed into a terminal of the device in order to control a propagation delay rate in the delay unit and the delay interpolator. The delay rate in a delay unit and a delay interpolator can be adjusted by a delay control voltage.

18 Claims, 15 Drawing Sheets

VOLTAGE CONTROLLED OSCILLATING DEVICE

FIELD OF THE INVENTION

The present invention relates to a voltage controlling/oscillating device in which the frequency of oscillation varies according to the voltage for controlling the frequency.

BACKGROUND OF THE INVENTION

FIG. 14 is a block diagram showing configuration of a voltage controlling/oscillating device based on the conventional technology. This voltage controlling/oscillating device 1 comprises a delay unit 11, a delay interpolator 12, and an inverting gate 13. A signal outputted from the output terminal OUT1 of the delay interpolator 12 is finally outputted from an output terminal 15 of the voltage controlling/oscillating device 1 to an external device as a clock signal CLK. The same signal as the output signal is also inputted into the inverting gate 13. The signal inputted into the inverting gate 13 is inputted with the phase thereof inverted into a first input terminal FST1 of the delay interpolator 12 and delay unit 11. The signal inputted into the delay unit 11 is delayed by a preset delay rate d1 and inputted into a second input terminal SLW1 of the delay interpolator 12. An oscillation frequency control voltage (Namely, a voltage for controlling the oscillation frequency) VCTL is inputted into a control terminal CTL1 of the delay interpolator 12 through an oscillation frequency control terminal 14 of the voltage controlling/oscillating device 1.

FIG. 15 is a circuit diagram showing detailed configuration of the voltage controlling/oscillating device 1. The delay unit 11 comprises four pieces of first to fourth transistors 101, 102, 103, and 104; three pieces of first to third current sources 105, 106, and 107; two pieces of resistors 108 and 109; and two pieces of capacitors 110 and 111, and constitute a differential switching circuit and an emitter follower. The circuit constant of the delay unit 11 is designed in such a way that a propagation delay between input and output thereof will be a desired delay rate d1.

The first transistor 101 of the differential switching circuit is connected to an input terminal IN of the delay unit 11 at the base terminal thereof, the collector terminal thereof is connected to a power supply terminal VCC through the loading resistor 108, and the emitter terminal thereof is connected to the first current source 105. The second transistor 102 of the differential switching circuit is connected to an inverting input terminal /IN (expressed with a bar over IN in the figure) of the delay unit 11 at the base terminal thereof, the collector terminal thereof is connected to the power supply terminal VCC through the loading resistor 109, and the emitter terminal thereof is connected to the first current source 105. The collector terminal of the first transistor 101 is connected to one electrode of the capacitor 110 and the collector terminal of the second transistor 102 is connected to one electrode of the capacitor 111, and the other electrodes of these capacitors are connected to the power supply terminal VCC. It should be noted that the symbol "/" in front of a terminal symbol in this specification represents that an inverted signal of an input or an output signal to a terminal with the same terminal symbol is inputted or outputted.

The collector terminal of the second transistor 102 is connected to the base terminal of the third transistor 103 of the emitter follower. In the third transistor 103, the collector terminal is connected to the power supply terminal VCC, and the emitter terminal is connected to the second current source 106 as well as to the output terminal OUT of the delay unit 11. The collector terminal of the first transistor 101 is connected to the base terminal of the fourth transistor 104 as the emitter follower. In the fourth transistor 104, the collector terminal is connected to the power supply terminal VCC, and the emitter terminal is connected to the third power supply terminal 107 as well as to the inverting output terminal /OUT of the delay unit 11. The output terminal /OUT and inverting output terminal /OUT of the delay unit 11 are connected to the second input terminal SLW1 and second inverting input terminal /SLW1 of the delay interpolator 12 respectively.

Herein, it is assumed that waveforms of signals inputted into the first input terminal FST1 and the second input terminal SLW1 of the delay interpolator 12 are Vfst (t) and Vslw (t); each input resistance, input capacity and delay constant of the first and second transistors 101 and 102 are rb, Cdif, and Kdif respectively. Further, it is assumed that each input capacity and delay constant of the third and fourth transistors 103 and 104 are Ceh and Keh respectively; and a cutoff angle frequency of the transistor is ωt. Also, it is assumed that the resistance of the resistors 108 and 109 is RL. Further, it is assumed that the current of the first current source 105 is IEE0, and the current of the second and third current sources 106 and 107 is IEE1. Then, the propagation delay d1 in the delay unit 11 can be expressed with the help of the following Equation (1).

$$d1 = V_{slw}(t) - V_{fst}(t) = rb/(RL \cdot \omega t) + rb \cdot Cdif + In(2) \cdot RL \cdot Ceh = rb/(RL \cdot \omega t) + rb \cdot Kdif \cdot IEE0 + In(2) \cdot RL \cdot Keh \cdot IEE1 \quad (1)$$

The first term and second term in the right side of this Equation (1) corresponds to a switching delay rate in the pair of differential transistors respectively, and the third term therein corresponds to a propagation delay rate in the emitter follower.

The delay interpolator 12 comprises eight pieces of the fifth to twelfth transistors 201, 202, 203, 204, 205, 206, 207, and 208; three pieces of the fourth to sixth current sources 209, 210, and 211; four pieces of resistors 212, 213, 214, and 215; and two pieces of capacitors 216 and 217, which constitute a current distributing circuit, a differential switching circuit, and an emitter follower. The circuit constant of the delay interpolator 12 is designed in such a way that a propagation delay between input and output thereof will be a desired delay rate d2.

In the fifth transistor 201 of the current distributing circuit, the base terminal is connected to a control terminal CTL1 of the delay interpolator 12, and the emitter terminal is connected to the fourth current source 209 through the resistor 212. In the sixth transistor 202 of the current distributing circuit, the base terminal is connected to an inverting control terminal /CTL1 of the delay interpolator 12, and the emitter terminal thereof is connected to the fourth current source 209 through the resistor 213.

In the seventh transistor 203 of the differential switching circuit, the base terminal is connected to the second input terminal SLW1 of the delay interpolator 12, the collector terminal is connected to the power supply terminal VCC through the loading resistor 214, and the emitter terminal is connected to the collector terminal of the fifth transistor 201. In the eighth transistor 204 of the differential switching circuit, the base terminal is connected to the second inverting input terminal /SLW1 of the delay interpolator 12, the collector terminal thereof is connected to the power supply terminal VCC through the loading resistor 215, and the emitter terminal is connected to the collector terminal of the fifth transistor 201.

In the ninth transistor 205 of the differential switching circuit, the base terminal is connected to the first input terminal FST1 of the delay interpolator 12, the collector terminal is connected to the collector terminal of the seventh transistor 203, and the emitter terminal is connected to the collector terminal of the sixth transistor 202. In the tenth transistor 206 of the differential switching circuit, the base terminal is connected to the first inverting input terminal /FST1 of the delay interpolator 12, the collector terminal is connected to the collector terminal of the eighth transistor 204, and the emitter terminal is connected to the collector terminal of the sixth transistor 202.

The capacitor 216 is connected in parallel with the resistor 214 between the collector terminal of the seventh and ninth transistors 203, 205 and the power supply terminal VCC. On the other hand, the capacitor 217 is connected in parallel with the resistor 215 between the collector terminal of the eight and tenth transistors 204, 206 and the power supply terminal VCC.

The collector terminal of the eighth transistor 204 is connected to the base terminal of the eleventh transistor 207 of the emitter follower. In the eleventh transistor 207, the collector terminal is connected to the power supply terminal VCC, and the emitter terminal is connected to the fifth current source 210 as well as to the output terminal OUT1 of the delay interpolator 12. The collector terminal of the seventh transistor 203 is connected to the base terminal of the twelfth transistor 208 of the emitter follower. In the twelfth transistor 208, the collector terminal is connected to the power supply terminal VCC, and the emitter terminal is connected to the sixth current source 211 as well as to the inverting output terminal /OUT1 of the delay interpolator 12.

The output terminal OUT1 of the delay interpolator 12 is connected to the inverting input terminal /IN of the delay unit 11 as well as to the first inverting input terminal /FST1 of the delay interpolator 12. The inverting output terminal /OUT1 of the delay interpolator 12 is connected to the input terminal IN of the delay unit 11 as well as to the first input terminal FST1 of the delay interpolator 12.

Herein, in the device shown in FIG. 14, although the phase of an output signal from the delay interpolator 12 is inverted at the inverting gate 13 and the inverted signal is inputted into the first input terminal FST1 of the delay interpolator 12 and the delay unit 11, the actual voltage controlling/oscillating device is designed in such a way that the differential output from the delay interpolator 12 is inputted with the phase thereof inverted into the first input terminal FST1 of the delay interpolator 12 as well as into the delay unit 11 in place of using the inverting gate 13 as shown in FIG. 15.

FIG. 16 is a timing chart for explaining an operational timing of the delay interpolator 12. Inputted into the second input terminal SLW1 of the delay interpolator 12 is the same signal as that inputted into the first input terminal FST1 with a delay equivalent to the propagation delay rate d1 in the delay unit 11. The delay interpolator 12 synthesizes the signals inputted into the first input terminal FST1 as well as into the second input terminal SLW1 respectively at a synthesizing ratio corresponding to the oscillation frequency control voltage VCTL inputted into the control terminal CTL1, and outputs the synthesized signal. A waveform V0(t) outputted from the delay interpolator 12 can be expressed with the help of the following Equation (2) and Equation (3) assuming that the synthesizing ratio is β.

$$V0(t)=V\text{fst}(t)+\beta[V\text{slw}(t)-V\text{fst}(t)]=V\text{fst}(t)+\beta \cdot d1 \qquad (2)$$

where $$0 \leq \beta 1 \qquad (3)$$

From the Equation (2) and Equation (3), it is clear that the waveform of an output signal from the delay interpolator 12 is the same as that of the signal inputted into the first input terminal FST1 which is a waveform with the phase thereof is delayed by β·d1. The synthesizing ratio β of the actual delay interpolator 12 is decided by changing a current distribution ratio of the fourth current source 209 utilizing the oscillation frequency control voltage VCTL fed to each base terminal of the pair of transistors 201 and 202.

Because the collector terminals of the pair of transistors 203 and 205 are commonly connected and also the collector terminals of the pair of transistors 204 and 206 are commonly connected, which are connected to the loading resistors 214 and 215 respectively, the waveform of an signal inputted into the first input terminal FST1 and the waveform of and signal inputted into the second input terminal SLW1 are synthesized. Herein, in the actual delay interpolator 12, as a propagation delay rate d2 specific to the delay interpolator 12 is added to a delay time indicated by β·d1, the waveform V0(t) of an output signal from the delay interpolator 12 can be expressed with the help of the following Equation (4).

$$V0(t)=V\text{fst}(t)+\beta \cdot d1+d2 \qquad (4)$$

Namely, an actual output signal from the delay interpolator 12 is the same as that inputted into the first input terminal FST1 and has a waveform with the phase thereof delayed by β·d1+d2. Herein, assuming that each input resistance and delay constant of the seventh to tenth transistors 203, 204, 205 and 206 are rb and Kdif respectively; each delay constant of the eleventh and twelfth transistors 207 and 208 is Keh; a cutoff angle frequency of the transistor is ωt; the resistance of the resistors 108 and 109 is RL; the current of the fourth current source 209 is IEE0, and the current of the fifth and sixth current sources 210 and 211 is IEE1, the propagation delay rate d2 can be expressed with the help of the following Equation (5).

$$d2=rb/(RL \cdot \omega t)+rb \cdot K\text{dif} \cdot IEE0+In(2) \cdot RL \cdot K\text{eh} \cdot IEE1 \qquad (5)$$

In Equation (5), the first term and second term in the right side thereof are each switching delay rate in the pairs of differential transistors 203, 204, 205, and 206 respectively, and the third term therein is a propagation delay rate in the emitter follower.

FIG. 17 is a timing chart for explaining an operational timing of the voltage controlling/oscillating device based on the conventional technology. The delay interpolator 12 synthesizes, as described above, an input signal into the first input terminal FST1 and an input signal into the second input terminal SLW1 at a synthesizing ratio according to the oscillation frequency control voltage VCTL inputted into the control terminal CTL1 and outputs the synthesized signal. The waveform of the output signal is the same as that of the input signal into the first input terminal FST1. The delay interpolator 12 forms a waveform with the phase thereof delayed by β·d1+d2. Namely, the change (indicated by timing T1 in FIG. 17) in a voltage level inputted into the first input terminal FST1 of the delay interpolator 12 is delayed by β·d1+d2, and outputted from the output terminal OUT1 of the delay interpolator 12 (timing T2).

As an output signal from the delay interpolator 12 is inputted with the phase thereof inverted by the inverting gate 13 into the first input terminal FST1 of the delay interpolator 12, the voltage level at the first input terminal FST1 is inverted at the point of time indicated by timing T2. Similarly, at the point of time indicated by timing T3 delayed by β·d1+d2 from timing T2, the voltage level at the first input terminal FST1 is inverted again and the voltage level of an output signal from the output terminal OUT1 is also inverted. By repeating this processing, the delay interpolator 12 outputs clock signals each of which output level is inverted at time intervals of β·d1+d2. Oscillation frequency fvco of this clock signal, minimum oscillation frequency fmin, maximum oscillation frequency fmax, and oscillation central frequency f0 thereof can be expressed with the help of the following Equation (6) to Equation (9) respectively.

$$fvco(\beta)=1/[2\cdot(\beta\cdot d1+d2)] \qquad (6)$$

$$fmin=fvco(\beta=0)=\frac{1}{2}[2\cdot d2] \qquad (7)$$

$$fmax=fvco(\beta=1)=\frac{1}{2}[2\cdot(d1+d2)] \qquad (8)$$

$$f0=fvoc(\beta=0.5)=1/(d1+2\cdot d2) \qquad (9)$$

As described above, the conventional type of voltage controlling/oscillating device is designed, as clearly understood from the Equation (7) to Equation (9), to essentially control the oscillation frequency by setting a propagation delay rate d1 in the delay unit 11 and a propagation delay rate d2 in the delay interpolator 12 and adjusting an oscillation frequency control voltage VCTL for deciding β.

However, when the conventional type of voltage controlling/oscillating device is made into an integrated circuit, input resistance rb, delay constants Cdif, Keh, and a cutoff angle frequency ωt of a transistor and the resistance RL have generally more than ±10% of variations derived from variations in manufacturing in the applied process. Accordingly, even if propagation delay rates d1, d2 are designed to get the oscillation central frequency f0, there is a problem such that displacement may occur in an actual oscillation central frequency in a manufacturing step.

Generally, as the voltage controlling/oscillating device is used in many cases for a phase-locked loop (PLL), if the oscillation central frequency is displaced from a design value, a constant phase error in the phase-locked loop may occur, which is disadvantageous. Therefore, loading resistance RL of the delay unit 11 and delay interpolator 12 is adjusted by laser trimming, and displacement of the oscillation central frequency due to variations in process is corrected. In this method, however, as laser trimming is performed while an oscillation central frequency is measured when bare chips for an integrated circuit is selected, a costly measurement system such as a high frequency prober is required, which significantly increases the capital investment.

SUMMARY OF THE INVENTION

It is an object of the present invention to obtain a voltage controlling/oscillating device designed to adjust a delay rate in one or both of a delay unit and a delay interpolator by controlling a delay control voltage in order to adjust each propagation delay rate in the delay unit and delay interpolator.

In order to achieve the object, the present invention comprises a delay unit in which a delay rate varies according to a first control signal for delaying an input signal and outputting the delayed signal; and a delay interpolator with a delay rate varying according to the first control signal for synthesizing a not-delayed input signal and a delayed input signal at a synthesizing ratio based on a second control signal and outputting the synthesized signal. Further, (1) an output signal from the delay interpolator is inputted with the phase thereof inverted into the delay unit; (2) an output signal from the delay interpolator is inputted with the phase thereof inverted into the delay interpolator as the not-delayed input signal; and (3) an output signal from the delay unit is inputted into the delay interpolator as the delayed input signal.

With the above invention, each delay rate in the delay unit and delay interpolator varies according to the first control signal. Further, the delay interpolator is controlled according to the second control signal, through which the oscillation frequency changes.

The present invention comprises a first delay unit and a second delay unit each in which a delay rate varies according to a first control signal for delaying an input signal and outputting the delayed signal; a first delay interpolator with a delay rate varying according to the first control signal for synthesizing a first not-delayed input signal and a first delayed input signal at a synthesizing ratio based on a second control signal and outputting the synthesized signal; and a second delay interpolator with a delay rate varying according to the first control signal for synthesizing a second not-delayed input signal and a second delayed input signal at the synthesizing ratio based on the second control signal and outputting the synthesized signal. Further, (1) an output signal from the second delay interpolator is inputted with the phase thereof inverted into the first delay unit; (2) an output signal from the second delay interpolator is inputted with the phase thereof inverted into the first delay interpolator as the first not-delayed input signal; (3) an output signal from the first delay unit is inputted into the first delay interpolator as the first delayed input signal; (4) an output signal from the first delay interpolator is inputted into the second delay unit; (5) an output signal from the first delay interpolator is inputted into the second delay interpolator as the second not-delayed input signal; and (6) an output signal from the second delay unit is inputted into the second delay interpolator as the second delayed input signal.

With the above invention, each delay rate in the first and second delay units as well as the first and second delay interpolators varies according to the first control signal. Further, the first and second delay interpolators are controlled according to the second control signal, through which the oscillation frequency changes.

Each of the inventions comprises a current source for flowing a specified current; and a current distributing circuit for distributing a current flown by the current source into a current path for passing a current through the delay unit or the delay interpolator and another current path at a ratio based on the first control signal.

With the above invention, the current source flows a specified current, the current distributing circuit distributes the current at a ratio according to the first control signal, and flows the distributed current to the delay unit or the delay interpolator.

The present invention comprises a delay unit for delaying an input signal and outputting the delayed signal; a first delay interpolator for synthesizing a first not-delayed input signal and a first delayed input signal at a synthesizing ratio based on a first control signal and outputting the synthesized signal; and a second delay interpolator for synthesizing a second not-delayed input signal and a second delayed input signal at a synthesizing ratio based on a second control signal and outputting the synthesized signal. Further, (1) an output signal from the first delay interpolator is inputted with the phase thereof inverted into the delay unit; (2) an output signal from the first delay interpolator is inputted into the second delay interpolator in the inverted phase thereof as the second not-delayed input signal; (3) an output signal from the first delay interpolator is inputted with the phase thereof inverted into the first delay interpolator as the first not-delayed input signal; (4) an output signal from the delay unit is inputted into the second delay interpolator as the second delayed input signal; and (5) an output signal from the second delay interpolator is inputted into the first delay interpolator as the first delayed input signal.

With the above invention, a delay rate in one of the first and second delay interpolators varies according to the first control signal, and the other delay interpolator is controlled according to the second control signal, through which the oscillation frequency changes.

The present invention comprises a first delay unit and a second delay unit each for delaying an input signal and outputting the delayed signal; a first delay interpolator for synthesizing a first not-delayed input signal and a first delayed input signal at a synthesizing ratio based on a first control signal and outputting the synthesized signal; a second delay interpolator for synthesizing a second not-delayed input signal and a second delayed input signal at a synthesizing ratio based on a second control signal and outputting the synthesized signal; a third delay interpolator for synthesizing a third not-delayed input signal and a third delayed input signal at the synthesizing ratio based on the first control signal and outputting the synthesized signal; and a fourth delay interpolator for synthesizing a fourth not-delayed input signal and a fourth delayed input signal at the synthesizing ratio based on the second control signal and outputting the synthesized signal. Further, (1) an output signal from the third delay interpolator is inputted with the phase thereof inverted into the first delay unit; (2) an output signal from the third delay interpolator is inputted with the phase thereof inverted into the second delay interpolator as the second not-delayed input signal; (3) an output signal from the third delay interpolator is inputted with the phase thereof inverted into the first delay interpolator as the first not-delayed input signal; (4) an output signal from the first delay unit is inputted into the second delay interpolator as the second delayed input signal; (5) an output signal from the second delay interpolator is inputted into the first delay interpolator as the first delayed input signal; (6) an output signal from the first delay interpolator is inputted into the second delay unit; (7) an output signal from the first delay interpolator is inputted into the fourth delay interpolator as the fourth not-delayed input signal; (8) an output signal from the first delay interpolator is inputted into the third delay interpolator as the third not-delayed input signal; (9) an output signal from the second delay unit is inputted into the fourth delay interpolator as the fourth delayed input signal; and (10) an output signal from the fourth delay interpolator is inputted into the third delay interpolator as the third delayed input signal.

With the above invention, a delay rate in one pair of delay interpolators between the pair of first and third delay interpolators and the pair of second and fourth delay interpolators varies according to the first control signal, and the other pair of delay interpolators are controlled according to the second control signal, through which the oscillation frequency changes.

The present invention comprises a delay unit for delaying an input signal and outputting the delayed signal; a first delay interpolator for synthesizing a first not-delayed input signal and a first delayed input signal at a synthesizing ratio based on a first control signal and outputting the synthesized signal; and a second delay interpolator for synthesizing a second not-delayed input signal and a second delayed input signal at a synthesizing ratio based on a second control signal and outputting the synthesized signal. Further, (1) an output signal from the first delay interpolator is inputted with the phase thereof inverted into the delay unit; (2) an output signal from the first delay interpolator is inputted with the phase thereof inverted into the second delay interpolator as the second not-delayed input signal; (3) an output signal from the delay unit is inputted into the second delay interpolator as the second delayed input signal; (4) an output signal from the delay unit is inputted into the first delay interpolator as the first not-delayed input signal; and (5) an output signal from the second delay interpolator is inputted into the first delay interpolator as the first delayed input signal.

With the above invention, a delay rate in one of the first and second delay interpolators varies according to the first control signal, and the other delay interpolator is controlled according to the second control signal, through which the oscillation frequency changes.

The present invention comprises a first delay unit and a second delay unit each for delaying an input signal and outputting the delayed signal; a first delay interpolator for synthesizing a first not-delayed input signal and a first delayed input signal at a synthesizing ratio based on a first control signal and outputting the synthesized signal; a second delay interpolator for synthesizing a second not-delayed input signal and a second delayed input signal at a synthesizing ratio based on a second control signal and outputting the synthesized signal; a third delay interpolator for synthesizing a third not-delayed input signal and a third delayed input signal at the synthesizing ratio based on the first control signal and outputting the synthesized signal; and a fourth delay interpolator for synthesizing a fourth not-delayed input signal and a fourth delayed input signal at the synthesizing ratio based on the second control signal and outputting the synthesized signal. Further, (1) an output signal from the third delay interpolator is inputted with the phase thereof inverted into the first delay unit; (2) an output signal from the third delay interpolator is inputted with the phase thereof inverted into the second delay interpolator as the second not-delayed input signal; (3) an output signal from the first delay unit is inputted into the second delay interpolator as the second delayed input signal; (4) an output signal from the first delay unit is inputted into the first delay interpolator as the first not-delayed input signal; (5) an output signal from the second delay interpolator is inputted into the first delay interpolator as the first delayed input signal; (6) an output signal from the first delay interpolator is inputted into the second delay unit; (7) an output signal from the first delay interpolator is inputted into the fourth delay interpolator as the fourth not-delayed input signal; (8) an output signal from the second delay unit is inputted into the fourth delay interpolator as the fourth delayed input signal; (9) an output signal from the second delay unit is inputted into the third delay interpolator as the third not-delayed input signal; and (10) an output signal from the fourth delay interpolator is inputted into the third delay interpolator as the third delayed input signal.

With the above invention, a delay rate in one pair of delay interpolators between the pair of first and third delay interpolators and the pair of second and fourth delay interpolators varies according to the first control signal, and the other pair of delay interpolators are controlled according to the second control signal, through which the oscillation frequency changes.

Other objects and features of this invention will become apparent from the following description with reference to the accompanying drawings.

DESCRIPTION OF THE PREFERRED EMBODIMENTS

Detailed description is made hereinafter for embodiments of the voltage controlling/oscillating device according to the present invention with reference to the drawings.

Figure 1:
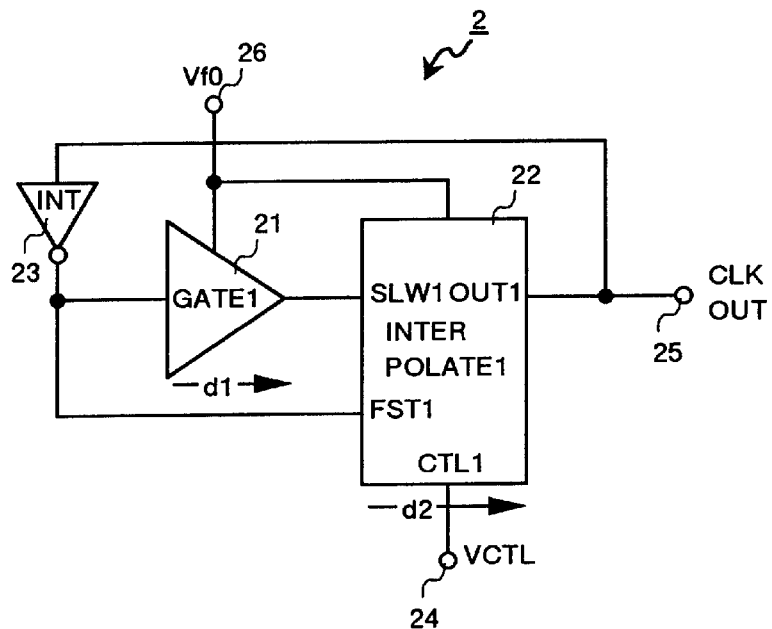
FIG. 1 is a block diagram showing configuration of the voltage controlling/oscillating device according to Embodiment 1 of the present invention.

FIG. 1 is a block diagram showing configuration of a voltage controlling/oscillating device according to Embodiment 1 of the present invention. This voltage controlling/oscillating device 2 comprises a delay unit 21, a delay interpolator 22, and an inverting gate 23. The device further has a delay control terminal 26 for setting each delay rate in the delay unit 21 and delay interpolator 22. A clock signal CLK outputted from an output terminal OUT1 of the delay interpolator 22 is outputted from an output terminal 25 of the voltage controlling/oscillating device 2 to an external device, the phase thereof is inverted by the inverting gate 23, and inputted into a first input terminal ST1 of the delay interpolator 22 and the delay unit 21. The signal inputted into the delay unit 21 is delayed by a specified delay rate d1 and inputted into a second input terminal SLW1 of he delay interpolator 22.

Fed to a control terminal CTL1 of the delay interpolator 22 is a control voltage (an oscillation frequency control voltage) VCTL to control an oscillation frequency through an oscillation frequency control terminal 24 of the voltage controlling/oscillating device 2. Fed to a delay control terminal 26 is a control voltage (delay control voltage) Vf0 to control a propagation delay rate. In the case shown in FIG. 1, the propagation delay rate in the delay unit 21 as well as the delay interpolator 22 is controlled by this delay control voltage Vf0.

Figure 15:
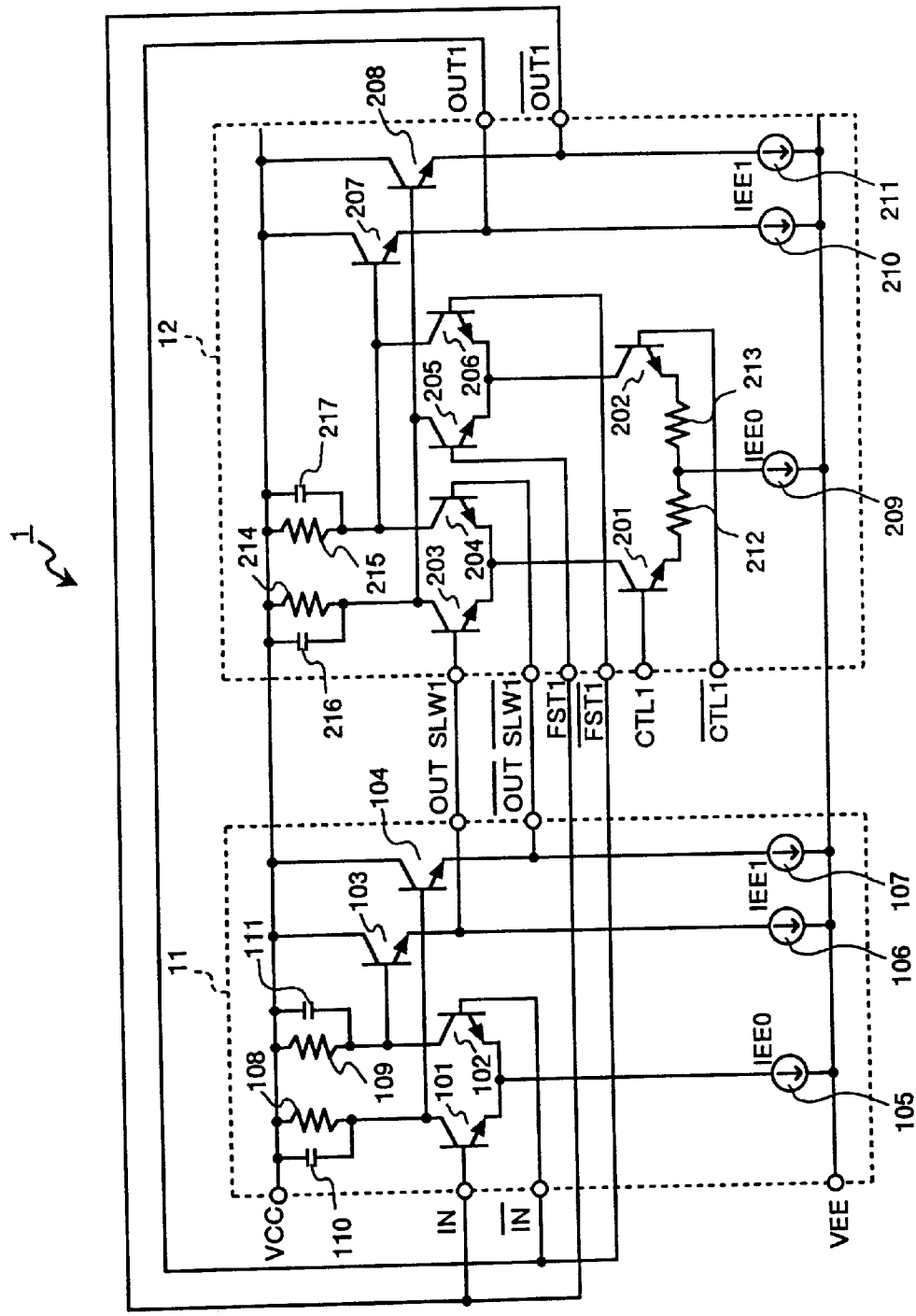
FIG. 15 is a circuit diagram showing detailed configuration of the voltage controlling/oscillating device based on the conventional technology.
Figure 16:
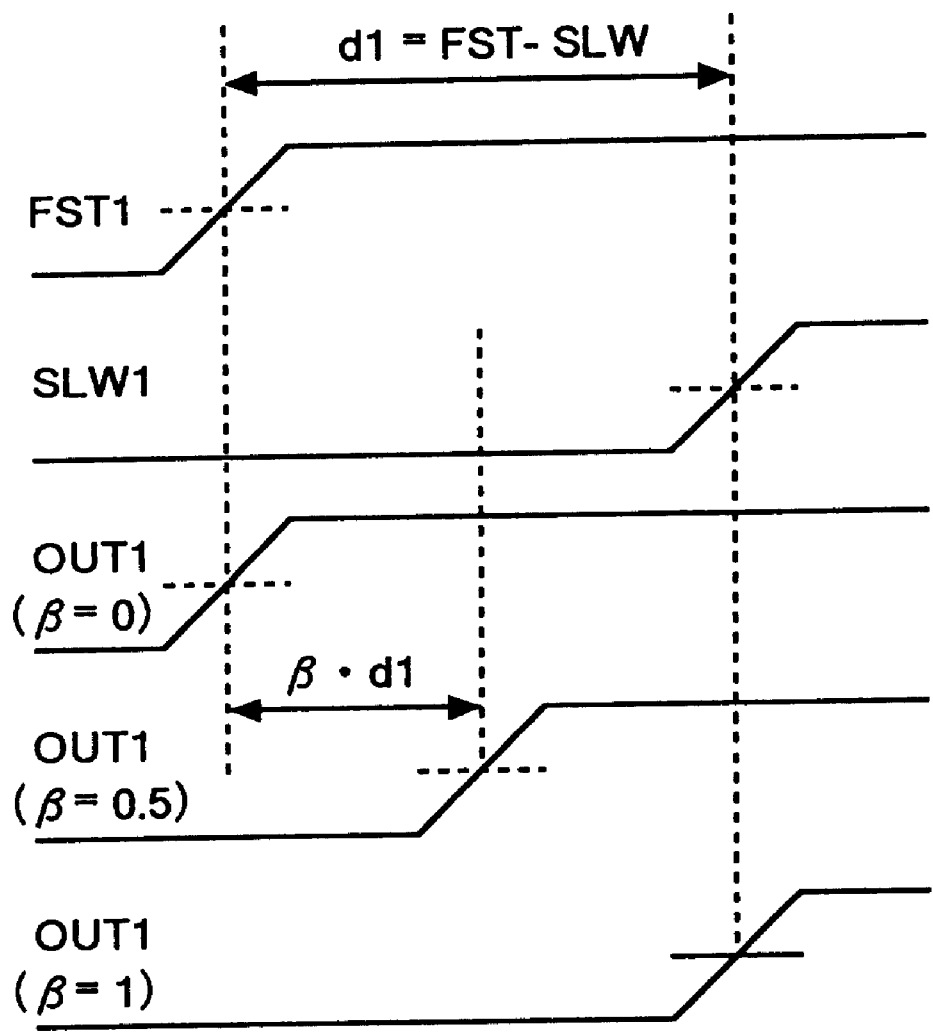
FIG. 16 is a timing chart for explaining an operational timing of the delay interpolator for the voltage controlling/oscillating device based on the conventional technology.
Figure 17:
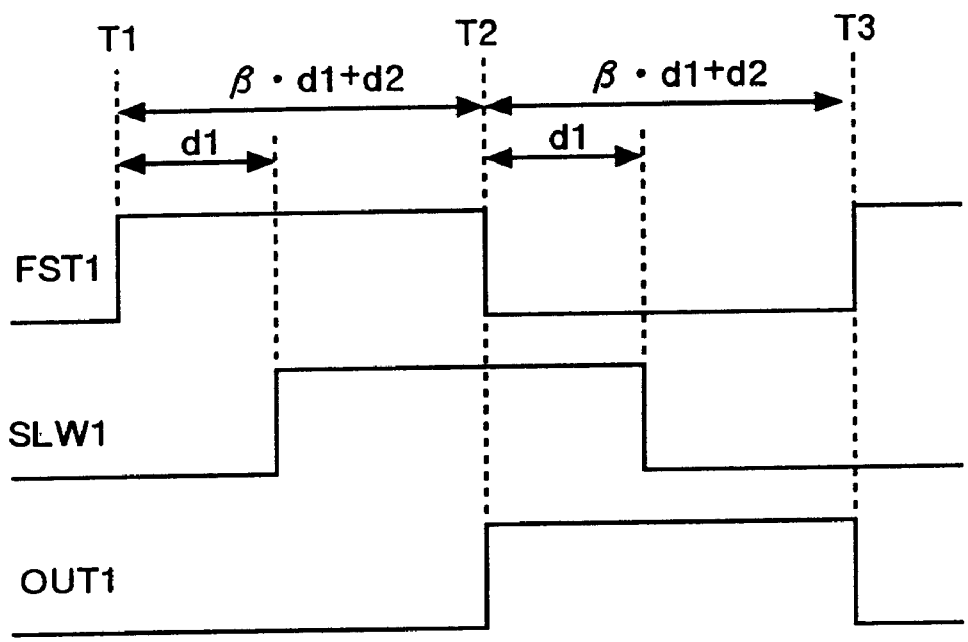
FIG. 17 is a timing chart for explaining an operational timing of the voltage controlling/oscillating device based on the conventional technology.

The delay unit 21 and delay interpolator 22 each are configured in the same manner as that, for instance, the delay unit 11 and delay interpolator 12 of the conventional type, as shown in detail, in the FIG. 15 excluding the current sources 105, 106, 107, 209, 210, and 211. The inverting gate 23 is also configured in the same as conventional type, and is realized based on, for example, the configuration that a differential output from the delay interpolator 22 is inputted into the first input terminal FST1 of the delay interpolator 22 and the delay unit 21 by inverting the phase thereof. The connection between the terminals is also the same as described above. Accordingly, in the voltage controlling/oscillating device 2 according to Embodiment 1, detailed description of the circuit excluding the circuit configuration of current sources corresponding to the six current sources 105, 106, 107, 209, 210, and 211 is omitted.

Figure 2:
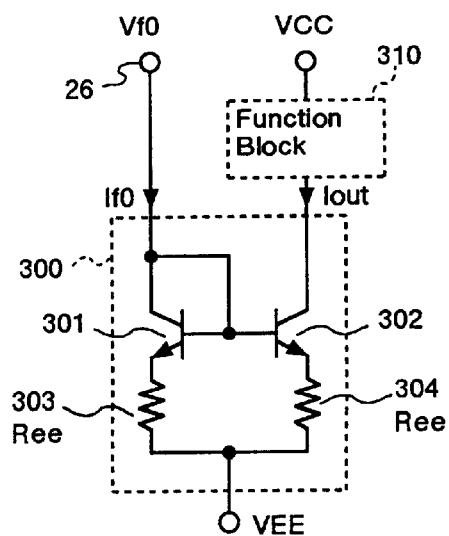
FIG. 2 is a circuit diagram showing configuration of a current source used in the voltage controlling/oscillating device.

FIG. 2 is a circuit diagram showing configuration of the current source used in the voltage controlling/oscillating device 2 according to Embodiment 2. This current source comprises a current mirror circuit 300 having a pair of transistors 301, 302 and a pair of resistors 303 and 304. The collector terminal of one transistor 301 is connected to the delay control terminal 26 and a delay control voltage Vf0 is fed thereto. The base terminal of the transistor 301 and the base terminal of the other transistor 302 are commonly connected to the collector terminal of the transistor 301. The emitter terminal of the transistor 301 is grounded through a resistor 303. The collector terminal and emitter terminal of the other transistor 302 are grounded through a function block 310 and a resistor 304 respectively. Herein, the function block 310 is a circuit block corresponding to the differential switching circuit and emitter follower, for instance, shown in FIG. 15.

The transistors 301 and 302 have same size, and assuming that a voltage between each base and each emitter thereof is Vbe and the resistors 303 and 304 are set to the same resistance value as each other and are Ree, a collector current If0 of the transistor 301 is equal to a collector current Iout of the transistor 302 which is an output current of this current source, which can be expressed with the help of the following Equation (10).

$$Iout=(Vf0-Vbe)/Ree \tag{10}$$

As clear from Equation (10), by adjusting the delay control voltage Vf0, the current value Iout of the current source can be controlled. By the way, propagation delay rates d1 and d2 of the delay unit 21 and delay interpolator 22 can be obtained using the Equation (1) and Equation (5) In the same manner as that based on the conventional technology. IEE0 and IEE1 in those equations are current values of the current sources each connected to the differential switching circuit and emitter follower in the delay unit 21 and delay interpolator 22 respectively. Accordingly, by adjusting the delay control voltage Vf0, the two propagation delay rates d1 and d2 can be adjusted.

In accordance with Embodiment 1, the voltage controlling/oscillating device 2 has the delay control terminal 26, and can control, by adjusting the delay control voltage Vf0 fed to the delay control terminal 26, the propagation delay rates d1 and d2 of the delay unit 21 and delay interpolator 22. Thus, the controls for an oscillation frequency and correction to a delay rate can discretely be carried out, and a voltage controlling/oscillating device with no variations in oscillation frequencies in each integrated circuit can be obtained. It should be noted that, although variations in the delay rate in the delay unit 21 and delay interpolator 22 are corrected in Embodiment 1, variations in the delay rate in the integrated circuits as a whole may be corrected by adjusting the delay rate in either of the delay unit 21 or the delay interpolator 22.

Figure 3:
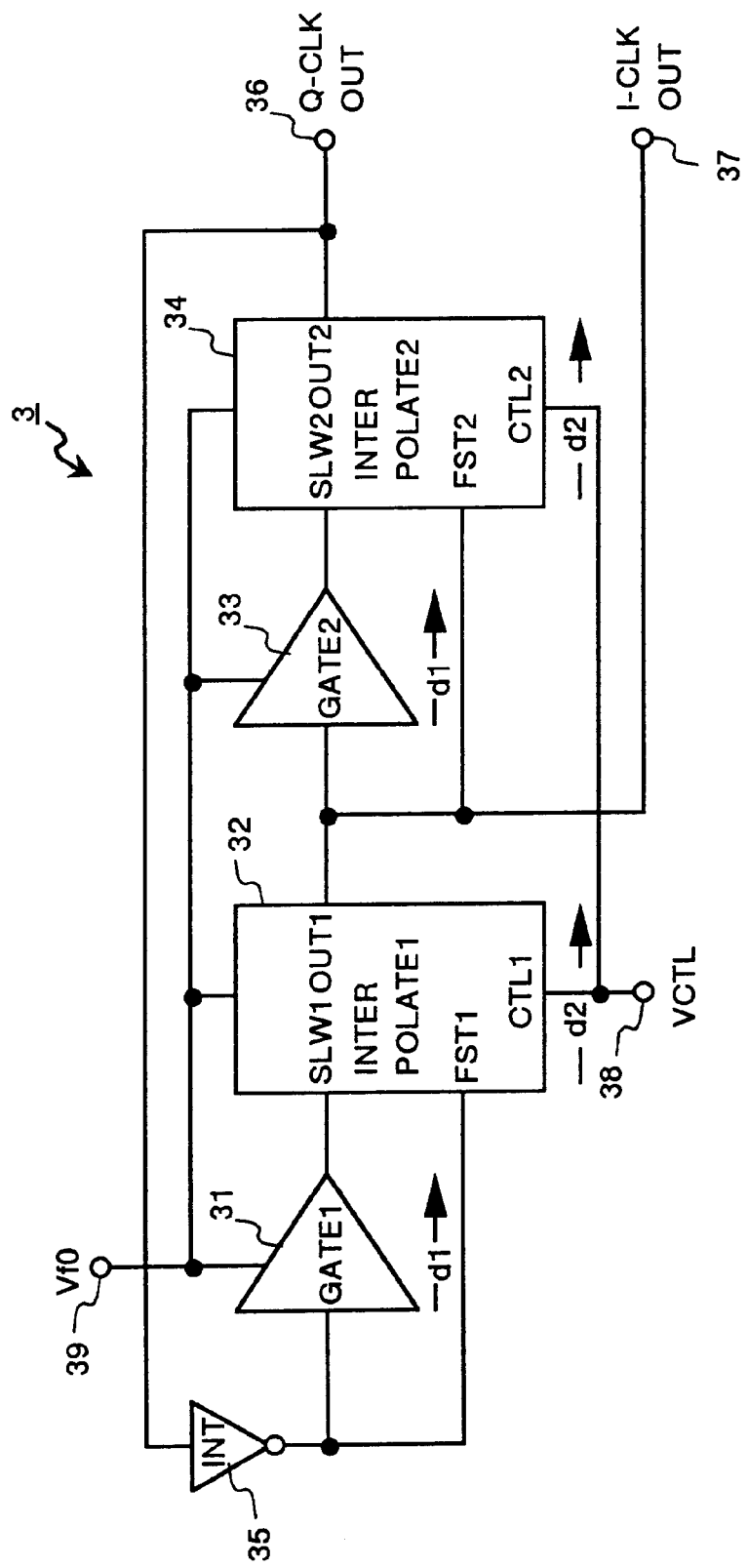
FIG. 3 is a block diagram showing configuration of the voltage controlling/oscillating device according to Embodiment 2 of the present invention.

FIG. 3 is a block diagram showing configuration of a voltage controlling/oscillating device according to Embodiment 2 of the present invention. This voltage controlling/oscillating device 3 comprises a first delay unit 31, a first delay interpolator 32, a second delay unit 33, a second delay interpolator 34, and an inverting gate 35. The device further has a delay control terminal 39 for setting each delay rate in the delay units 31, 33 and delay interpolators 32 and 34.

A Q clock signal Q-CLK outputted from an output terminal OUT2 of the second delay interpolator 34 is outputted from a Q output terminal 36 of the voltage controlling/oscillating device 3 to an external device, the phase thereof is inverted by the inverting gate 35, and inputted into a first input terminal FST1 of the first delay interpolator 32 and the first delay unit 31. The signal inputted into the first delay unit 31 is delayed by a specified delay rate d1 and inputted into a second input terminal SLW1 of the first delay interpolator 32.

An I clock signal I-CLK outputted from an output terminal OUT1 of the first delay interpolator 32 is outputted from an I output terminal 37 of the voltage controlling/oscillating device 3 to an external device, and also inputted into a first input terminal FST2 of the second delay interpolator 34 and the second delay unit 33. The signal inputted into the second delay unit 33 is delayed by a specified delay rate d1 and inputted into a second input terminal SLW2 of the second delay interpolator 34.

Fed to the control terminals CTL1, CTL2 of the first and second delay interpolators 32, 34 is an oscillation frequency control voltage VCTL through an oscillation frequency control terminal 38 of the voltage controlling/oscillating device 3. Fed to a delay control terminal 39 is a delay control voltage Vf0. In the case shown in FIG. 3, each propagation delay rate in the first and second delay units 31, 33 and the first and second delay interpolator 32, 34 is to be controlled by this delay control voltage Vf0.

The first and second delay units 31 and 33 have the same configuration as each other and have the same propagation delay rate d1. The first and second delay interpolators 32 and 34 have also the same configuration as each other and have the same propagation delay rate d2. As each configuration of the first and second delay units 31, 33 and the first and second delay interpolators 32, 34 is the same as that in Embodiment 1, the current mirror circuit having the configuration shown in FIG. 2 is used as a current source, and as the configuration of the other sections in the circuit is the same as that based on the conventional technology, description of the overlapping sections is omitted herein.

Figure 4:
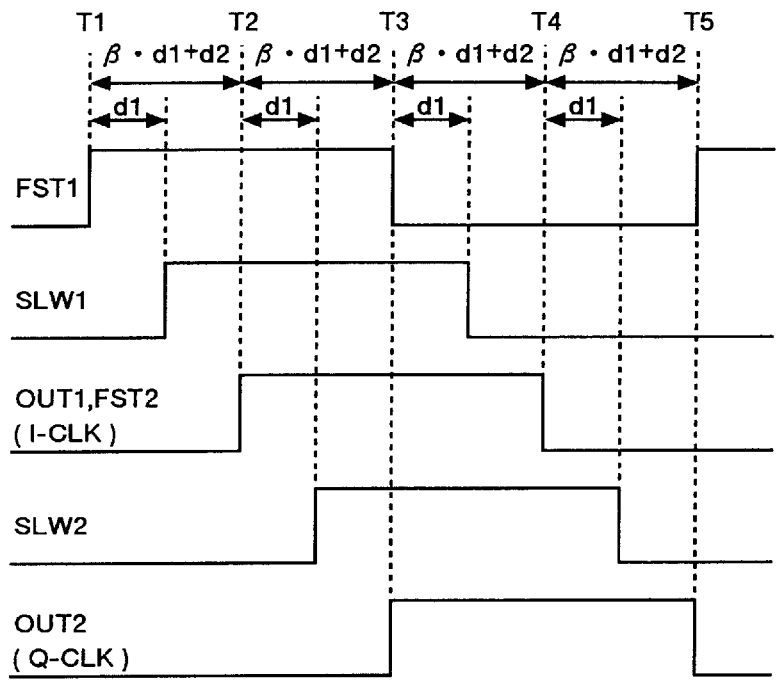
FIG. 4 is a timing chart for explaining an operational timing of the voltage controlling/oscillating device.

FIG. 4 is a timing chart for explaining an operational timing of the voltage controlling/oscillating device 3. When a voltage level inputted into the first input terminal FST1 of the first delay interpolator 31 changes due to a trigger such as activation of a power supply voltage (timing T1), the change is delayed by $\oplus \cdot d1+d2$ and outputted from the output terminal OUT1 of the first delay interpolator 32 (timing T2), and the delayed output is further delayed by $\beta \cdot d1+d2$ and outputted from the output terminal OUT2 of the second delay interpolator 34 (timing T3). As the phase of an output signal from this output terminal OUT2 is inverted by the inverting gate 35 and inputted into the first input terminal FST1 of the first delay interpolator 32, the voltage level of the signal inputted into the first input terminal FST1 is inverted at the timing T3.

Then, the voltage level at the first input terminal FST1 of the first delay interpolator 32 is inverted again at the timing T5 delayed by $2 \cdot (\beta \cdot d1+d2)$ from the timing T3. By repeating this operation, the output terminal OUT2 of the second delay interpolator 34 outputs a clock signal obtained by inverting the output level at time intervals of $2 \cdot (\beta \cdot d1+d2)$. The oscillation frequency fvco of the clock signal can be expressed with the following Equation (11).

$$fvco(\beta)=\frac{1}{4}[4 \cdot (\beta d1+d2)] \quad (11)$$

As shown in Equation (11), as a periodicity of the clock signal is $4 \cdot (\beta \cdot d1+d2)$, the delay rate of $\beta \cdot d1+d2$ corresponding to the periodicity of this clock signal is a delay rate of 90 degree. As shown in FIG. 4, as a delay difference between the timing Tn+1 and the timing Tn is $\beta \cdot d1+d2$, there is a phase difference of 90 degree between the I clock signal I-CLK outputted from the output terminal OUT1 of the first delay interpolator 32 and the Q clock signal Q-CLK outputted from the output terminal OUT2 of the second delay interpolator 34.

In accordance with Embodiment 2, the voltage controlling/oscillating device 3 has the delay control terminal 39, and can control, by adjusting a delay control voltage Vf0 fed to the delay control terminal 39, propagation delay rates d1 and d2 of the first and second delay units 31, 33 and the first and second delay interpolators 32, 34. Thus, the controls for an oscillation frequency and correction to a delay rate can discretely be carried out, and hence it is possible to obtain a voltage controlling/oscillating device with no variations in oscillation frequencies in each integrated circuit for outputting two clock signals having the phase displacement of 90 degree therebetween. Accordingly, the present invention in Embodiment 2 is preferable as a component of the phase-locked loop (PLL).

It should be noted that, although variations in each delay rate in the first and second delay units 31, 33 as well as of the first and second delay interpolator 32, 34 have been corrected in Embodiment 2, variations in a delay rate in the whole integrated circuit may be corrected by adjusting only one of the delay rates.

It is assumed in Embodiment 2 that there is no propagation delay at the inverting gate 35. However, if the propagation delay at the inverting gate 35 can not be ignored then a gate circuit having the same propagation delay as that at the inverting gate 35 may be inserted in a location immediately after the output terminal OUT1 of the first delay interpolator 32.

Figure 5:
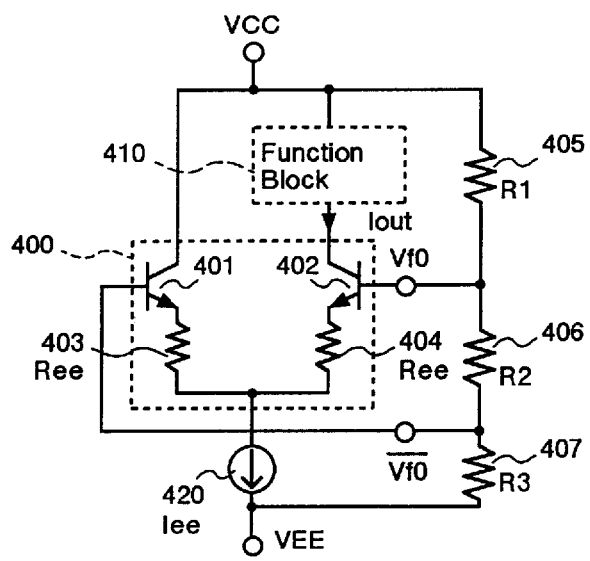
FIG. 5 is a circuit diagram showing configuration of a current source according to Embodiment 3 of the present invention.

FIG. 5 is a circuit diagram showing configuration of a current source according to Embodiment 3 of the present invention. As for this current source, a current from a current source 420 for outputting a present current value Iee is distributed according to differentially given control voltages Vf0 by a current distributing circuit 400, and outputs the current, for instance, to the delay unit 21 and delay interpolator 22 shown in FIG. 1 or the delay unit and delay interpolator of the second Embodiment. This current source is used as a current source corresponding to the conventional type of six current sources 105, 106, 107, 209, 210, and 211.

The current distributing circuit 400 has transistors 401, 402 of the same size and resistors 403, 404 having the same resistance value Ree. The collector terminal of one transistor 401 is connected to a power supply terminal VCC, and the emitter terminal thereof is connected to a current source 420 through a resistor 403. The collector terminal of the other transistor 402 is connected to a function block 410, and the emitter terminal thereof is connected to the current source 420 through a resistor 404. Differentially given control voltages Vf0 are inputted into the bases of the transistor 401 and transistor 402.

Resister 405 having a resistance of R1 is provided between the power supply terminal VCC and the base terminal of the transistor 402. Resister 406 having a resistance of R2 is provided between the base terminal of the transistor 402 and the base terminal of the transistor 401. Resister 407 having a resistance of R3 is provided between the base terminal of the transistor 402 and a ground terminal. Herein the function block 410 is a circuit block, for instance, corresponding to the differential switching circuit and emitter follower shown in FIG. 15.

An output current Iout from the current distributing circuit 400 can be expressed with the help of the following Equation (12) assuming that a voltage difference between differentially given control voltages is $\pm \Delta V$.

$$Iout = Iee/2 + \Delta V/Ree \tag{12}$$

As $\Delta V$ is a voltage difference between differentially given control voltages, the second term in the right side of Equation (12) is not affected by common mode noise due to signal interference or the like inside the circuit. Accordingly, the current value represented in the second term does not vary due to common mode noise. Herein, assuming that a current source configured based on the current mirror circuit shown in FIG. 5 is used as the current source 420 then the current value Iee can be expressed with the help of the above Equation (10). Therefore, fluctuations in a current value due to common mode noise can be reduced to half as compared to that of the current source based on the current mirror circuit shown in FIG. 2.

In accordance with Embodiment 3, a current is distributed according to differentially given control voltages Vf0 by the current distributing circuit 400, and is fed, for instance, to the delay unit 21 and delay interpolator 22 shown in FIG. 1, so that each fluctuation rate of delay of the delay unit 21 and delay interpolator 22 affected by common mode noise can be reduced to half. Further, occurrence of jitter in a clock signal as an output from the voltage controlling/oscillating device can be suppressed.

Figure 6:
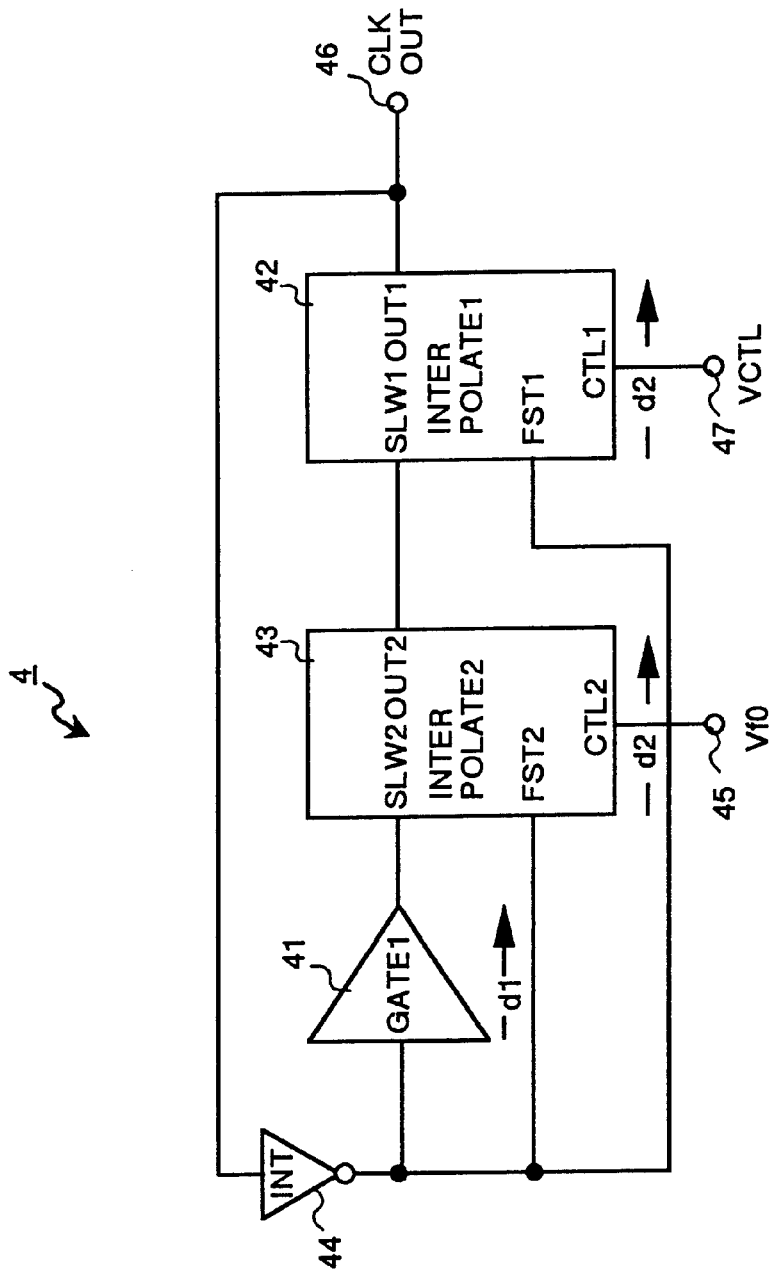
FIG. 6 is a block diagram showing configuration of the voltage controlling/oscillating device according to Embodiment 4 of the present invention.

FIG. 6 is a block diagram showing configuration of a voltage controlling/oscillating device according to Embodiment 4 of the present invention. This voltage controlling/oscillating device 4 comprises a delay unit 41, a first delay interpolator 42, a second delay interpolator 43, and an inverting gate 44. The device further has a delay control terminal 45 for setting a delay rate in the second delay interpolator 43.

A clock signal CLK outputted from an output terminal OUT1 of the first delay interpolator 42 is outputted from an output terminal 46 of the voltage controlling/oscillating device 4 to an external device, the phase thereof is inverted by the inverting gate 44, and inputted into a first input terminal FST2 of the second delay interpolator 43, the delay unit 41, and the first input terminal FST1 of the first delay interpolator 42. The signal inputted into the delay unit 41 is delayed by a specified delay rate d1 and inputted into a second input terminal SLW2 of the second delay interpolator 43. The signal inputted into the second delay interpolator 43 is outputted from the output terminal OUT2 thereof to be inputted into the second input terminal SLW1 of the first delay interpolator 42.

Fed to a control terminal CTL1 of the first delay interpolator 42 is an oscillation frequency control voltage VCTL through an oscillation frequency control terminal 47 of the voltage controlling/oscillating device 4. The delay control voltage Vf0 fed through the delay control terminal 45 is supplied to a control terminal CTL2 of the second delay interpolator 43.

Each of the delay unit 41 as well as the first and second delay interpolator 42, 43 has the same configuration as that of the conventional type thereof, for instance, the same circuit configuration as that of the conventional type of delay unit 11 and delay interpolator 12 shown in detail in FIG. 15. The connection between the inverting gate 44 and the terminals is also the same as that of the conventional type thereof. Accordingly, the detailed description thereof is omitted herein.

Figure 7:
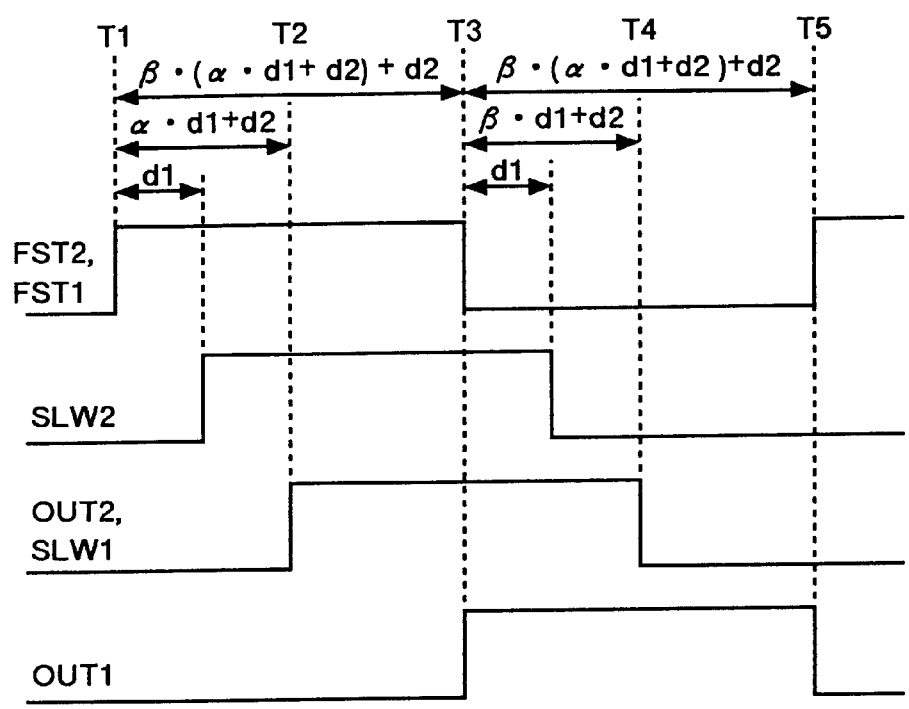
FIG. 7 is a timing chart for explaining an operational timing of the voltage controlling/oscillating device.

FIG. 7 is a timing chart for explaining an operational timing of the voltage controlling/oscillating device 3. Herein, it is assumed that the second delay interpolator 43 has the same configuration as that of the first delay interpolator 42 and has the same propagation delay rate d2. It is also assumed that a synthesizing ratio of the second delay interpolator 43 controlled by the delay control terminal 45 is $\alpha$. Change (timing T1) in a voltage level inputted into the first input terminal FST2 of the second delay interpolator 43 due to a trigger such as activation of a power supply voltage is delayed by $\alpha \cdot d1 + d2$ and outputted from the output terminal OUT2 thereof (timing T2).

The change in the voltage level outputted from the output terminal OUT2 thereof is delayed by $\beta \cdot (\alpha \cdot d1 + d2) + d2$ and outputted from the output terminal OUT1 of the first delay interpolator 42 (timing T3). As an output signal from the output terminal OUT1 is inputted with the phase thereof inverted by the inverting gate 44 into the first input terminal FST1 of the first delay interpolator 42, the voltage level of the signal inputted into the first input terminal FST1 is inverted at the timing T3.

Then, the voltage level at the first input terminal FST1 of the first delay interpolator 42 is inverted again at the timing T5 delayed by $\beta \cdot (\alpha \cdot d1 + d2) + d2$ from the timing T3. By repeating this operation, the output terminal OUT1 of the first delay interpolator 42 outputs a clock signal obtained by inverting the output level at time intervals of $\beta \cdot (\alpha \cdot d1 + d2) + d2$. The oscillation frequency fvco of the clock signal is expressed by the following Equation (13).

$$fvco(\alpha, \beta) = 1/[2 \cdot [\beta \cdot (\alpha \cdot d1 + d2) + d2]] \tag{13}$$

Herein, as the propagation delay rate d1 and propagation delay rate d2 are expressed by Equation (1) and Equation (5) respectively, variations on manufacturing in the delay rates d1, d2 can be corrected by setting a delay rate in the second delay interpolator 43.

In accordance with Embodiment 4, the voltage controlling/oscillating device 4 has the delay control terminal 45, and controls, by adjusting a delay control voltage Vf0 fed to the delay control terminal 45, a propagation delay rate in the second delay interpolator 43, by which a propagation delay rate in the whole integrated circuit can be adjusted. Thus, controls for an oscillation frequency and correction to a delay rate can discretely be carried out, and it is possible to obtain a voltage controlling/oscillating device with no variations in oscillation frequencies in each integrated circuit.

It should be noted that, although an oscillation frequency is controlled by the oscillation frequency control terminal 47 and a delay rate is corrected by the delay control terminal 45 in Embodiment 4, there may be employed a configuration such that the delay rate is corrected by the oscillation frequency control terminal 47 and the oscillation frequency is controlled by the delay control terminal 45.

Figure 8:
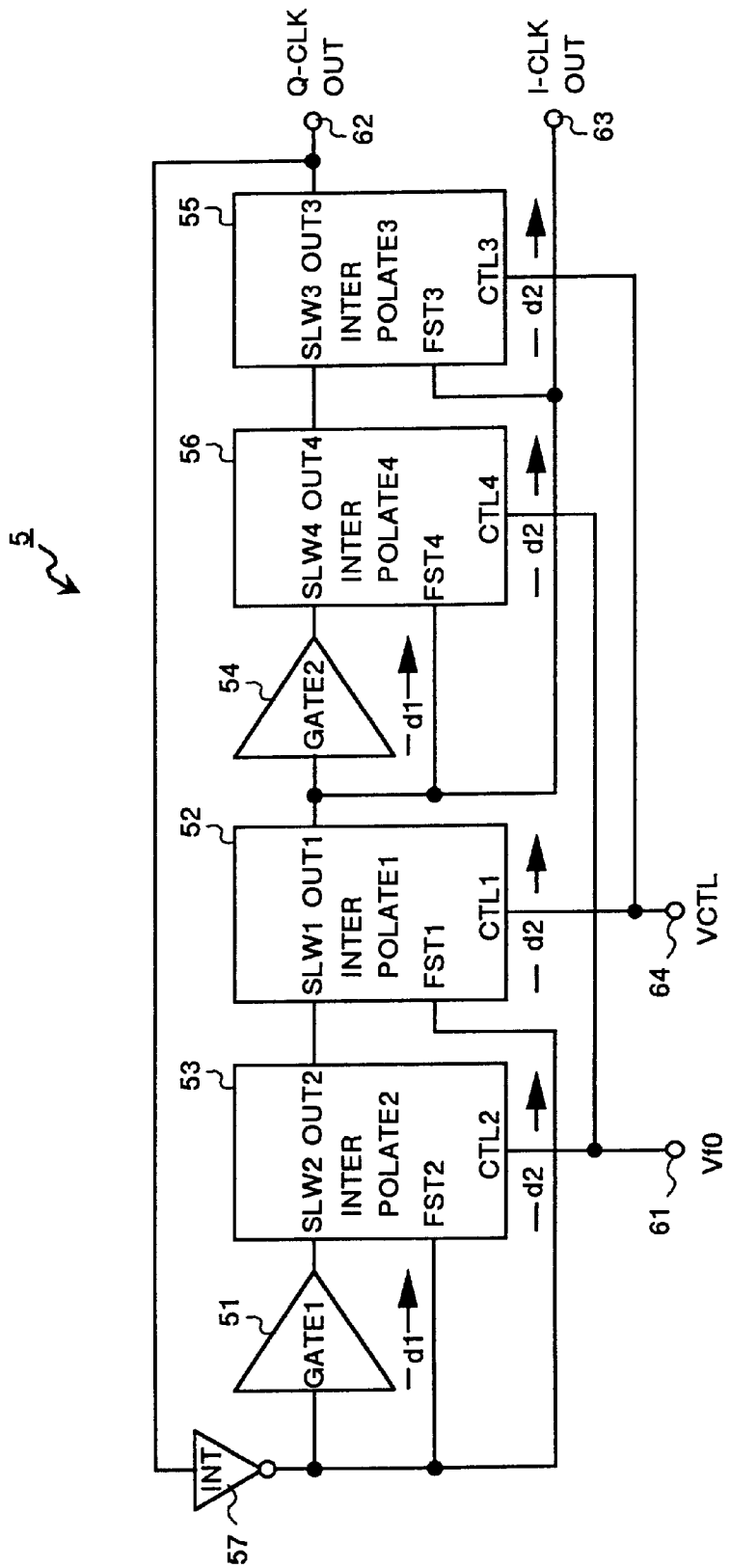
FIG. 8 is a block diagram showing configuration of the voltage controlling/oscillating device according to Embodiment 5 of the present invention.

FIG. 8 is a block diagram showing configuration of a voltage controlling/oscillating device according to Embodiment 5 of the present invention. This voltage controlling/oscillating device 5 comprises a first delay unit 51, a first delay interpolator 52, a second delay interpolator 53, a second delay unit 54, a third delay interpolator 55, a fourth delay interpolator 56, and an inverting gate 57. The device further has a delay control terminal 61 for setting a delay rate in the second delay interpolator 53 and the fourth delay interpolator 56.

A Q clock signal Q-CLK outputted from an output terminal OUT3 of the third delay interpolator 55 is outputted from a Q output terminal 62 of the voltage controlling/oscillating device 5 to an external device, the phase thereof is inverted by the inverting gate 57, and inputted into first input terminal FST1 of the first delay interpolator 52, first input terminal FST2 of the second delay interpolator 53, and the first delay unit 51. The signal inputted into the first delay unit 51 is delayed by a specified delay rate d1 and inputted into a second input terminal SLW2 of the second delay interpolator 53.

The signal outputted from the output terminal OUT2 of the second delay interpolator 53 is inputted into the second input terminal SLW1 of the first delay interpolator 52. Then, an I clock signal I-CLK outputted from an output terminal OUT1 of the first delay interpolator 52 is outputted from an I output terminal 63 of the voltage controlling/oscillating device 5 to an external device, and also inputted into first input terminal FST3 of the third delay interpolator 55, the first input terminal FST4 of the forth delay interpolator 56, and into the second delay unit 54. The signal inputted into the second delay unit 54 is delayed by a specified delay rate d1 and inputted into a second input terminal SLW2 of the fourth delay interpolator 56. The signal outputted from an output terminal OUT4 of the fourth delay interpolator 56 is inputted into a second input terminal SLW3 of the third delay interpolator 55.

Fed to the control terminals CTL1, CTL3 of the first and third delay interpolators 52, 55 is an oscillation frequency control voltage VCTL through an oscillation frequency control terminal 64 of the voltage controlling/oscillating device 5. The delay control voltage Vf0 fed through the delay control terminal 61 is fed to control terminals CTL2, CTL4 of the second and fourth delay interpolator 53 and 56.

Each of the first and second delay units 51, 54 and the first to the fourth delay interpolators 52, 53, 55, and 56 has the same configuration as that of the conventional type thereof, for instance, the same circuit configuration as that of the conventional type of delay unit 11 and delay interpolator 12 shown in detail in FIG. 15. The connection between the inverting gate 57 and the terminals is also the same as that of the conventional type thereof. Accordingly, the detailed description thereof is omitted herein.

Figure 9:
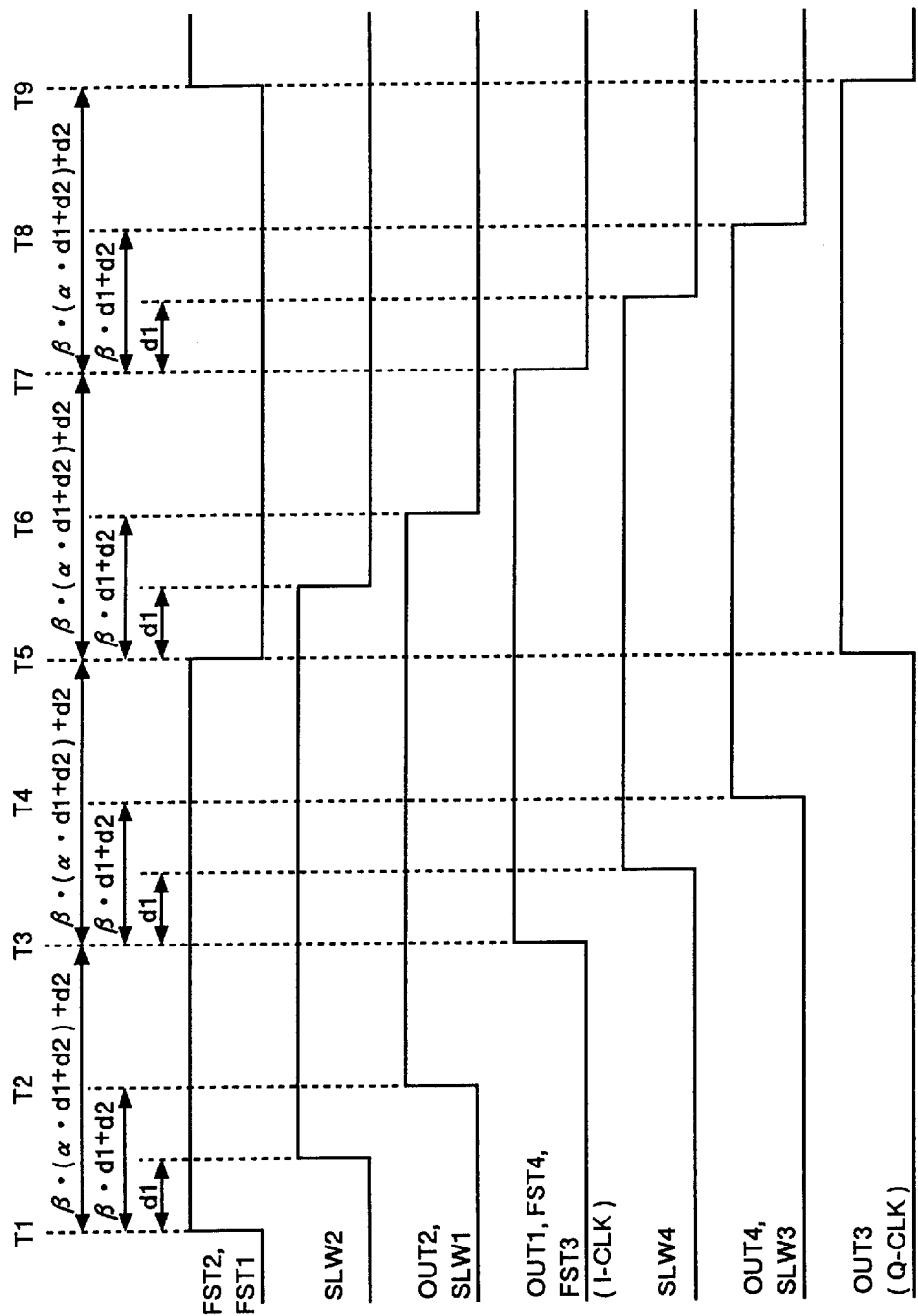
FIG. 9 is a timing chart for explaining an operational timing of the voltage controlling/oscillating device.

FIG. 9 is a timing chart for explaining an operational timing of the voltage controlling/oscillating device 5.

Herein, it is assumed the first delay unit 51 and second delay unit 54 have the same configuration as each other and have the same propagation delay rate d1. It is also assumed that the first delay interpolator 52, second delay interpolator 53, third delay interpolator 55, and fourth delay interpolator 56 have the same configuration as each other and have the same propagation delay rate d2.

Change (timing T1) in a voltage level inputted into the first input terminal FST1 of the first delay interpolator 52 due to a trigger such as activation of a power supply voltage is delayed by $\beta \cdot (\alpha \cdot d1+d2)+d2$ and outputted from the output terminal OUT1 thereof, and further delayed by $\beta \cdot (\alpha d1+d2)+d2$ from the timing T3 and outputted from the output terminal OUT3 of the third delay interpolator 55 (timing T5). The output signal from the output terminal OUT3 is inputted with the phase thereof inverted by the inverting gate 57 into the first input terminal FST1 of the first delay interpolator 52, so that the voltage level in the signal inputted into the first input terminal FST1 is inverted at the timing T5.

Similarly, at the timing T9 further delayed by $2 \cdot [\beta \cdot (\alpha \cdot d1+d2)+d2]$ from the timing T5, the voltage level at the first input terminal FST1 of the first delay interpolator 52 is inverted again. By repeating the operations, the output terminal OUT1 of the first delay interpolator 52 outputs a clock signal obtained by inverting an output level at time intervals of $2 \cdot [\beta \cdot (\alpha \cdot d1+d2)+d2]$. An oscillation frequency fvco of the clock signal can be expressed with the help of the following Equation (14).

$$fvco(\beta)=1/[4 \cdot [\beta \cdot (\alpha \cdot d1+d2)+d2]] \tag{14}$$

As shown in Equation (14), as a periodicity of the clock signal is $4 \cdot [\beta \cdot (\alpha \cdot d1+d2)+d2]$, the delay rate of $\beta \cdot (\alpha d1+d2)+d2$ corresponding to the periodicity of this clock signal is a delay rate 90 degree. Accordingly, as shown in FIG. 9, there is a phase difference of 90 degree between the I clock signal I-CLK outputted from the output terminal OUT1 of the first delay interpolator 52 and the Q clock signal Q-CLK outputted from the output terminal OUT3 of the third delay interpolator 55.

In accordance with Embodiment 5, the voltage controlling/oscillating device 5 has the delay control terminal 61, and controls, by adjusting a delay control voltage Vf0 fed to the delay control terminal 61, each propagation delay rate in the second and fourth delay interpolators 53, 56. Thus, correction to a delay rate can discretely be carried out from controls for an oscillation frequency, and hence it is possible to obtain a voltage controlling/oscillating device with no variations in oscillation frequencies in each integrated circuit for outputting two clock signals having the phase displacement of 90 degree therebetween. Accordingly, the present invention in Embodiment 5 is preferable as a component of the phase-locked loop (PLL).

It should be noted that, it is assumed in Embodiment 5 that there is no propagation delay at the inverting gate 57. However, if the propagation delay at the inverting gate 57 can not be ignored then a gate circuit having the same propagation delay as that at the inverting gate 57 may be inserted in a location immediately after the output terminal OUT1 of the first delay interpolator 52.

Figure 10:
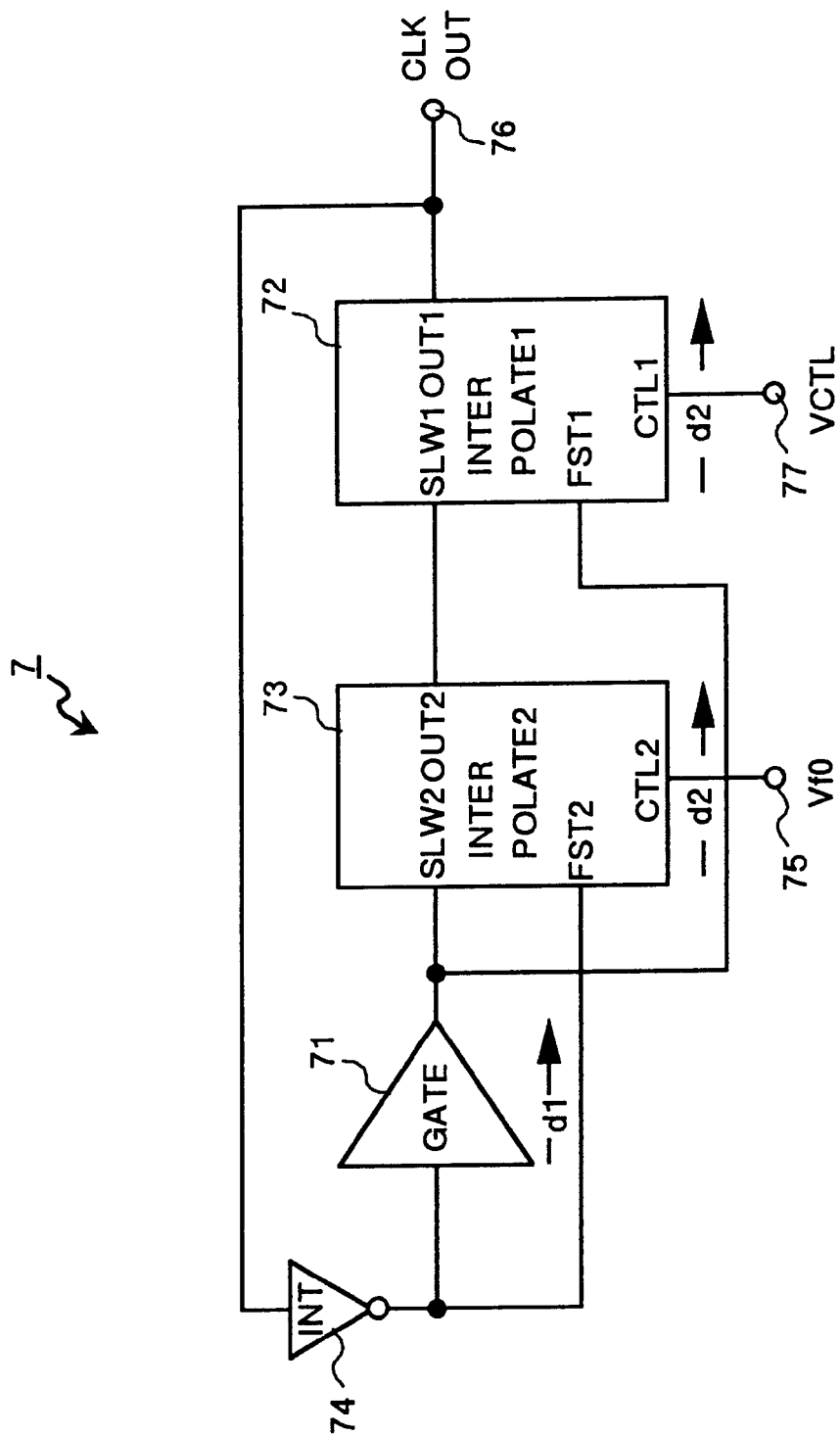
FIG. 10 is a block diagram showing configuration of the voltage controlling/oscillating device according to Embodiment 6 of the present invention.

FIG. 10 is a block diagram showing configuration of a voltage controlling/oscillating device according to Embodiment 6 of the present invention. This voltage controlling/oscillating device 7 comprises a delay unit 71, a first delay interpolator 72, a second delay interpolator 73, and an inverting gate 74. The device further has a delay control terminal 75 for setting a delay rate in the second delay interpolator 73.

A clock signal CLK outputted from an output terminal OUT1 of the first delay interpolator 72 is outputted from an output terminal 76 of the voltage controlling/oscillating device 7 to an external device, the phase thereof is inverted by the inverting gate 74, and inputted into a first input terminal FST2 of the second delay interpolator 73 and into the delay unit 71. The signal inputted into the delay unit 71 is delayed by a specified delay rate d1 and inputted into a second input terminal SLW2 of the second delay interpolator 73 and into a first input terminal SLW1 of the first delay interpolator 72. The signal inputted into the second delay interpolator 73 is outputted from the output terminal OUT2 thereof to be inputted into the second input terminal SLW1 of the first delay interpolator 72.

Fed to a control terminal CTL1 of the first delay interpolator 72 is an oscillation frequency control voltage VCTL through an oscillation frequency control terminal 77 of the voltage controlling/oscillating device 7. The delay control voltage Vf0 fed through the delay control terminal 75 is supplied to a control terminal CTL2 of the second delay interpolator 73.

Each of the delay unit 71 as well as the first and second delay interpolators 72, 73 has the same configuration as that of the conventional type thereof, for instance, the same circuit configuration as that of the conventional type of delay unit 11 and delay interpolator 12 shown in detail in FIG. 15. The connection between the inverting gate 74 and the terminals is also the same as that of the conventional type thereof. Accordingly, the detailed description thereof is omitted herein.

Figure 11:
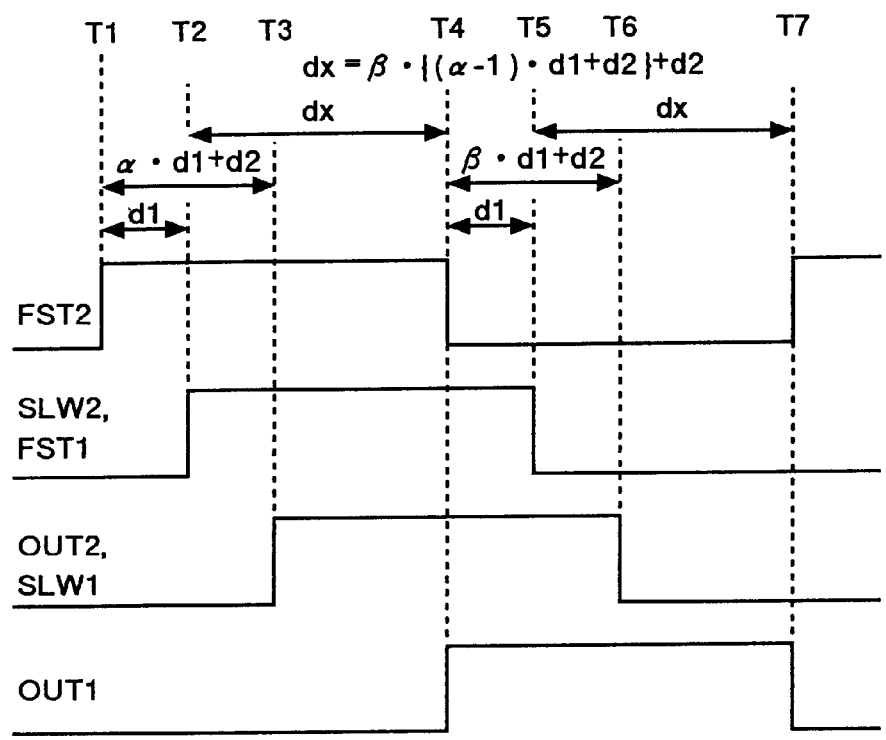
FIG. 11 is a timing chart for explaining an operational timing of the voltage controlling/oscillating device.

FIG. 11 is a timing chart for explaining an operational timing of the voltage controlling/oscillating device 7. Herein, it is assumed that the second delay interpolator 73 has the same configuration as that of the first delay interpolator 72 and has the same propagation delay rate d2. It is also assumed that a synthesizing ratio of the second delay interpolator 73 controlled by the delay control terminal 75 is α. Change (timing T1) in a voltage level inputted into the first input terminal FST2 of the second delay interpolator 73 due to a trigger such as activation of a power supply voltage is delayed by α·d1+d2 and outputted from the output terminal OUT2 thereof (timing T3).

Inputted into the first input terminal FST1 of the first delay interpolator 72, on the other hand, is a signal delayed by d1 by the delay unit 71 (timing T2), so that the change in the voltage level generated due to the trigger described above is delayed by β·[(α−1)·d1+d2]+d2 from timing T2 and outputted from the output terminal OUT1 of the first delay interpolator 72 (timing T4). As an output signal from the output terminal OUT1 is further inputted with the phase thereof inverted by the inverting gate 74 into the first input terminal FST1 of the first delay interpolator 72 through the delay unit 71, the voltage level of the input signal is delayed by d1 from the timing T4 and inverted (timing T5).

Then, the voltage level at the output terminal OUT1 of the first delay interpolator 72 is inverted again at the timing T7 delayed by β·[(α−1)·d1+d2]+d1+d2 from the timing T4. By repeating this operation, the output terminal OUT1 of the first delay interpolator 72 outputs a clock signal obtained by inverting the output level at time intervals of β·[(α−1)·d1+d2]+d1+d2. The oscillation frequency fvco of the clock signal can be expressed with the help of the following Equation (15).

$$fvco(\alpha, \beta)=1/[2\cdot[\beta[(\alpha-1)\cdot d1+d2]+d1+d2]] \quad (15)$$

Herein, as the propagation delay rate d1 and propagation delay rate d2 are expressed by Equation (1) and Equation (5) respectively, variations on manufacturing in the delay rates d1, d2 can be corrected by setting a delay rate in the second delay interpolator 73.

In accordance with Embodiment 6, the voltage controlling/oscillating device 7 has the delay control terminal 75, and controls, by adjusting a delay control voltage Vf0 fed to the delay control terminal 75, a propagation delay rate in the second delay interpolator 73, by which a propagation delay rate in the whole integrated circuit can be adjusted. Thus, controls for an oscillation frequency and correction to a delay rate can discretely be carried out, and hence it is possible to obtain a voltage controlling/oscillating device with no variations in oscillation frequencies in each integrated circuit.

It should be noted that, although an oscillation frequency is controlled by the oscillation frequency control terminal 77 and a delay rate is corrected by the delay control terminal 75 in Embodiment 6, there may be employed a configuration in which the delay rate is corrected by the oscillation frequency control terminal 77 and the oscillation frequency is controlled by the delay control terminal 75.

Figure 12:
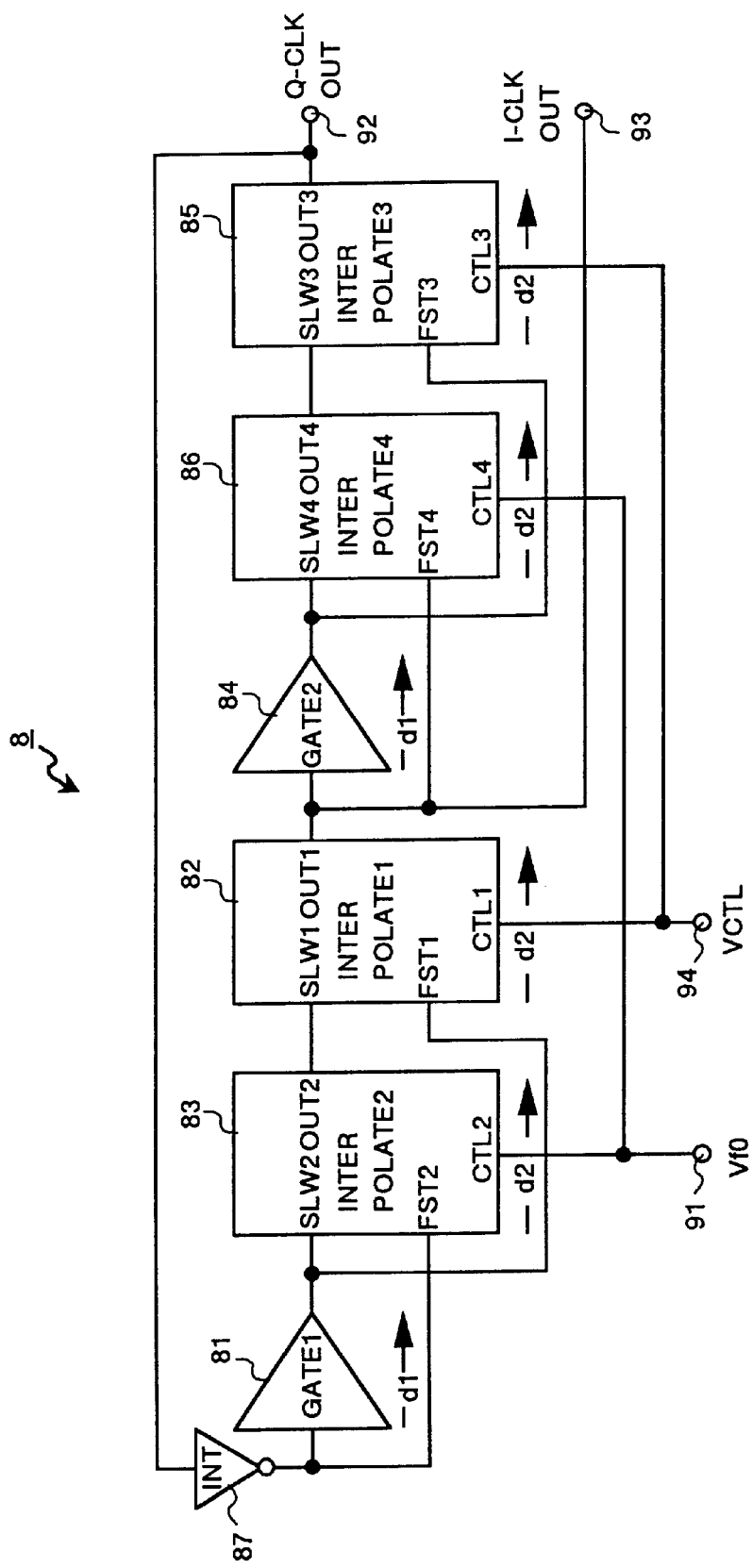
FIG. 12 is a block diagram showing configuration of the voltage controlling/oscillating device according to Embodiment 7 of the present invention.

FIG. 12 is a block diagram showing configuration of a voltage controlling/oscillating device according to Embodiment 7 of the present invention. This voltage controlling/oscillating device 8 comprises a first delay unit 81, a first delay interpolator 82, a second delay interpolator 83, a second delay unit 84, a third delay interpolator 85, a fourth delay interpolator 86, and an inverting gate 87. The device further has a delay control terminal 91 for setting each delay rate in the second delay interpolator 83 and the fourth delay interpolator 86.

A Q clock signal Q-CLK outputted from an output terminal OUT3 of the third delay interpolator 85 is outputted from a Q output terminal 92 of the voltage controlling/oscillating device 8 to an external device, the phase thereof is inverted by the inverting gate 87, and inputted into a first input terminal FST2 of the second delay interpolator 83 and into the first delay unit 81. The signal inputted into the first delay unit 81 is delayed by a specified delay rate d1 and inputted into a second input terminal SLW2 of the second delay interpolator 83 and a first input terminal FST1 of the first delay interpolator 82.

The signal outputted from the output terminal OUT2 of the second delay interpolator 83 is inputted into the second input terminal SLW1 of the first delay interpolator 82. Then, an I clock signal I-CLK outputted from an output terminal OUT1 of the first delay interpolator 82 is outputted from an I output terminal 93 of the voltage controlling/oscillating device 8 to an external device, and also inputted into a first input terminal FST4 of the fourth delay interpolator 86 and into the second delay unit 84. The signal inputted into the second delay unit 84 is delayed by a specified delay rate d1 and inputted into a second input terminal SLW2 of the fourth delay interpolator 86 and a first input terminal FST3 of the third delay interpolator 85. The signal outputted from an output terminal OUT4 of the fourth delay interpolator 86 is inputted into a second input terminal SLW3 of the third delay interpolator 85.

Fed to the control terminals CTL1, CTL3 of the first and third delay interpolators 82, 85 is an oscillation frequency control voltage VCTL through an oscillation frequency control terminal 94 of the voltage controlling/oscillating device 8. The delay control voltage Vf0 fed through the delay control terminal 91 is fed to control terminals CTL2, CTL4 of the second and fourth delay interpolator 83 and 86.

Each of the first and second delay units 81, 84 and the first to the fourth delay interpolators 82, 83, 85, and 86 has the same configuration as that of the conventional type thereof, for instance, the same circuit configuration as that of the conventional type of delay unit 11 and delay interpolator 12 shown in detail in FIG. 15. The connection between the inverting gate 87 and the terminals is also the same as that of the conventional type thereof. Accordingly, the detailed description thereof is omitted herein.

Figure 13:
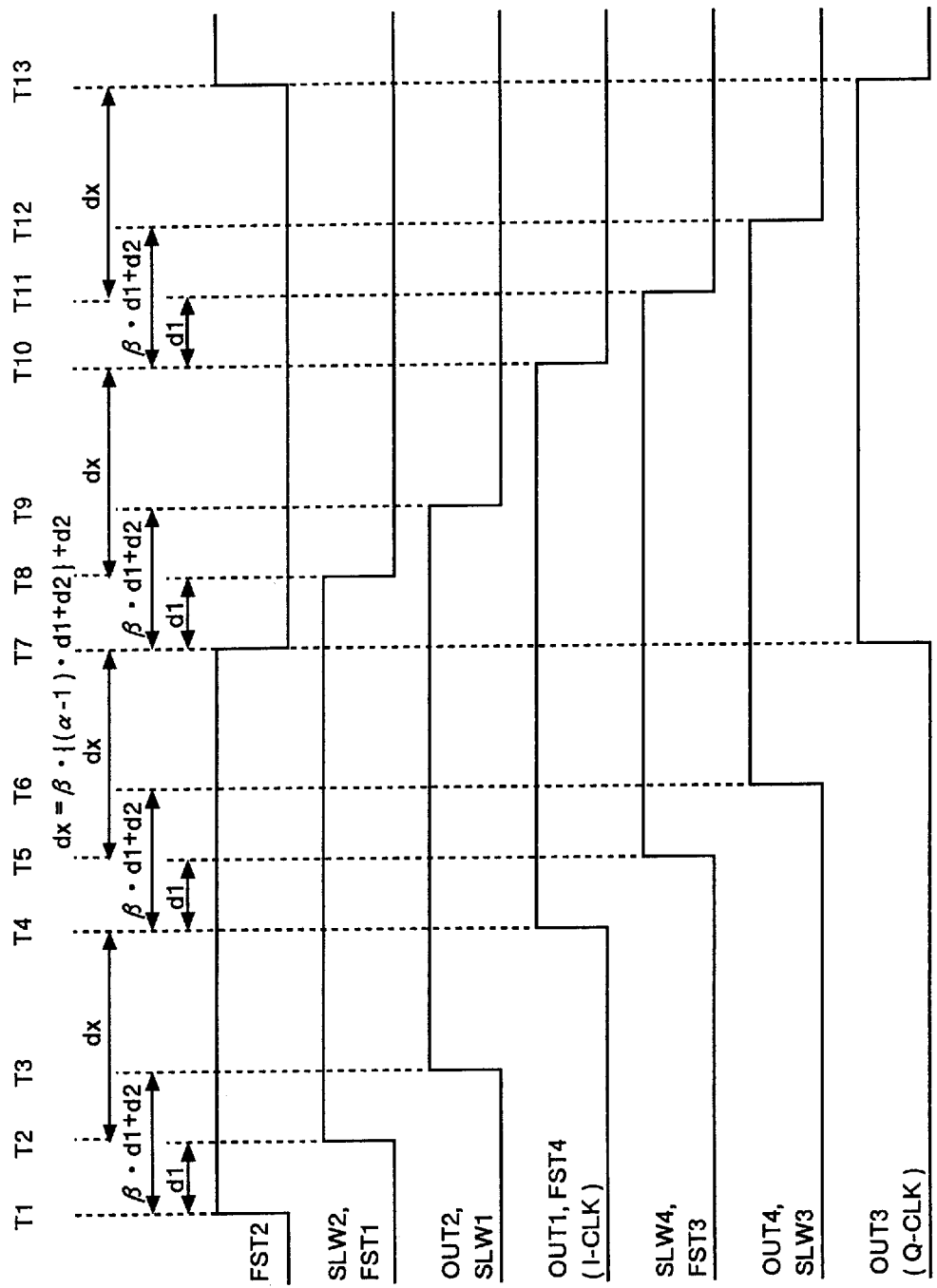
FIG. 13 is a timing chart for explaining an operational timing of the voltage controlling/oscillating device.
Figure 14:
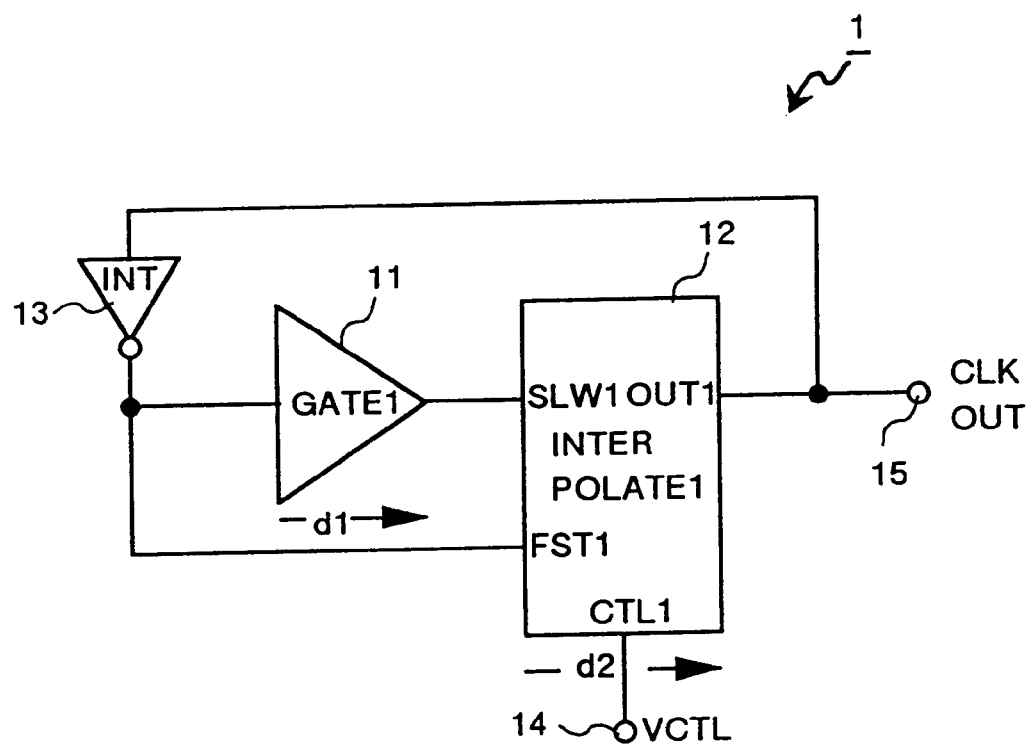
FIG. 14 is a block diagram showing configuration of the voltage controlling/oscillating device based on the conventional technology.

FIG. 13 is a timing chart for explaining an operational timing of the voltage controlling/oscillating device 8. Herein, it is assumed the first delay unit 81 and second delay unit 84 have the same configuration as each other and have the same propagation delay rate d1. It is also assumed that the first delay interpolator 82, second delay interpolator 83, third delay interpolator 85, and fourth delay interpolator 86 have the same configuration as each other and have the same propagation delay rate d2.

Change (timing T1) in a voltage level inputted into the first input terminal FST2 of the second delay interpolator 83 due to a trigger such as activation of a power supply voltage is delayed by $\beta \cdot d1+d2$ and outputted from the output terminal OUT 2 thereof (timing T3). Inputted into the first input terminal FST1 of the first delay interpolator 82, on the other hand, is a signal delayed by d1 by the first delay unit 81 (timing T2), so that the change in the voltage level generated due to the trigger described above is delayed by $\beta \cdot [(\alpha-1) \cdot d1+d2]+d2$ from timing T2 and outputted from the output terminal OUT1 of the first delay interpolator 82 (timing T4).

As the output signal from the output terminal OUT1 is delayed by d1 by the second delay unit 84 and inputted into the first input terminal FST3 of the third delay interpolator 85 (timing T5), the change in the voltage level generated due to the trigger described above is delayed by $\beta \cdot [(\alpha-1) \cdot d1+d2]+d2$ from timing T5 and outputted from the output terminal OUT3 of the third delay interpolator 85 (timing T7). The output signal from the output terminal OUT3 is inputted with the phase thereof inverted by the inverting gate 87 into the first input terminal FST2 of the second delay interpolator 83 and also delayed by d1 by the first delay unit 81 to be inputted in the first input terminal FST1 of the first delay interpolator 82, so that the voltage level at the input terminal FST2 is inverted at timing T7, and the voltage level at the input terminal FST1 is inverted at timing T8 delayed by d1 therefrom.

Similarly, at the timing T13 further delayed by $2 \cdot [\beta \cdot [(\alpha-1) \cdot d1+d2)]+d1+d2]$ from the timing T7, the voltage level at the first input terminal FST2 of the second delay interpolator 83 is inverted again. The voltage level at the first input terminal FST1 of the first delay interpolator 82 is delayed by d1 from timing T13 and inverted again. By repeating the operations, the output terminal OUT1 of the first delay interpolator 82 outputs a clock signal obtained by inverting an output level at time intervals of $2 \cdot \beta \cdot [(\alpha-1) \cdot d1+d2)]+d1+d2]$. An oscillation frequency fvco of the clock signal can be expressed with the help of the following Equation (16).

$$fvco(\beta)=1/[4 \cdot [\beta \cdot (\alpha-1) \cdot d1+d2)]+d1+d2] \quad (16)$$

As shown in Equation (16), as a periodicity of the clock signal is $[4 \cdot [\beta \cdot [(\alpha-1) \cdot d1+d2)]+d1+d2]$, the delay rate of $\beta \cdot [(\alpha-1) \cdot d1+d2)]+d1+d2$ corresponding to the periodicity of this clock signal is the delay rate of 90 degree. Accordingly, as shown in FIG. 13, there is a phase difference of 90 degree between the I clock signal I-CLK outputted from the output terminal OUT1 of the first delay interpolator 82 and the Q clock signal Q-CLK outputted from the output terminal OUT3 of the third delay interpolator 85.

In accordance with Embodiment 7, the voltage controlling/oscillating device 8 has the delay control terminal 91, and controls, by adjusting a delay control voltage Vf0 fed to the delay control terminal 91, each propagation delay rate in the second and fourth delay interpolators 83, 86, by which correction to a delay rate can discretely be carried out from controls for an oscillation frequency. Therefore, it is possible to obtain a voltage controlling/oscillating device with no variations in oscillation frequencies in each integrated circuit for outputting two clock signals having the phase displacement of 90 degree therebetween. Accordingly, the present invention in Embodiment 7 is preferable as a component of the phase-locked loop (PLL).

It should be noted that, it is assumed in Embodiment 7 that there is no propagation delay at the inverting gate 87. However, if propagation delay at the inverting gate 87 cannot be ignored then a gate circuit having the same propagation delay as that at the inverting gate 87 may be inserted in a location immediately after the output terminal OUT1 of the first delay interpolator 82.

As described above, with the present invention, each delay rate in the delay unit and delay interpolator varies according to the first control signal, the delay interpolator is controlled according to the second control signal, and an oscillation frequency changes, and so each propagation delay rate in the delay unit and delay interpolator can be controlled. Thus, controls for an oscillation frequency and correction to a delay rate can discretely be carried out, and hence it is possible to obtain a voltage controlling/oscillating device with no variations in oscillation frequencies in each integrated circuit.

With another aspect of the present invention, each delay rate in the first and second delay units as well as the first and second delay interpolators varies according to the first control signal, the first and second delay interpolators are controlled according to the second control signal, and an oscillation frequency changes, and so each propagation delay rate in the first and second delay units as well as the first and delay interpolators can be controlled. Thus, controls for an oscillation frequency and correction to a delay rate can discretely be carried out, and hence it is possible to obtain a voltage controlling/oscillating device with no variations in oscillation frequencies in each integrated circuit for outputting two clock signals having the phase displacement of 90 degree therebetween.

With another aspect of the present invention, the current source flows a specified current, the current distributing circuit distributes the current at a ratio according to the first control signal, and flows the distributed current to the delay unit or the delay interpolator, so that each fluctuation rate of delay of the delay unit and delay interpolator affected by common mode noise can be reduced to half as compared to that of an ordinary current mirror circuit. Therefore, occurrence of jitter in a clock signal as an output from the voltage controlling/oscillating device can be suppressed.

With another aspect of the present invention, a delay rate in one of the first and second delay interpolators varies according to the first control signal, the other delay interpolator is controlled according to the second control signal, and an oscillation frequency changes. Thus, by controlling a propagation delay rate in either one of the delay interpolators, a propagation delay rate in the whole integrated circuit can be adjusted. Therefore, controls for an oscillation frequency and correction to a delay rate can discretely be carried out, and it is possible to obtain a voltage controlling/oscillating device with no variations in oscillation frequencies in each integrated circuit.

With another aspect of the present invention, a delay rate in one pair of delay interpolators between the pair of first and third delay interpolators and the pair of second and fourth delay interpolators varies according to the first control signal, the other pair of delay interpolators are controlled according to the second control signal, and an oscillation frequency changes. Thus, by controlling a propagation delay rate in either one pair of delay interpolators, correction to a delay rate can discretely be carried out from controls for an oscillation frequency, and hence it is possible to obtain a voltage controlling/oscillating device with no variations in oscillation frequencies in each integrated circuit for outputting two clock signals having the phase displacement of 90 degree therebetween.

With another aspect of the present invention, a delay rate in one of the first and second delay interpolators varies according to the first control signal, the other delay interpolator is controlled according to the second control signal, and an oscillation frequency changes. Thus, by controlling a propagation delay rate in either one of the delay interpolators, a propagation delay rate in the whole integrated circuit can be adjusted. Therefore, controls for an oscillation frequency and correction to a delay rate can discretely be carried out, and it is possible to obtain a voltage controlling/oscillating device with no variations in oscillation frequencies in each integrated circuit.

With another aspect of the present invention, a delay rate in one pair of delay interpolators between the pair of first and third delay interpolators and the pair of second and fourth delay interpolators varies according to the first control signal, the other pair of delay interpolators are controlled according to the second control signal, and an oscillation frequency changes. Thus, by controlling a propagation delay rate in either one pair of delay interpolators, correction to a delay rate can discretely be carried out from controls for an oscillation frequency. Therefore, it is possible to obtain a voltage controlling/oscillating device with no variations in oscillation frequencies in each integrated circuit for outputting two clock signals having the phase displacement of 90 degree therebetween.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A voltage controlled oscillating device comprising:
    a delay unit in which a delay rate varies according to a first control signal, which delay unit delays an input signal and outputs the delayed signal; and
    a delay interpolator in which a delay rate varies according to a first control signal, which delay interpolator synthesizes a not-delayed input signal and a delayed input signal at a synthesizing ratio based on a second control signal and outputs the synthesized signal; wherein
        an output signal from said delay interpolator is inputted into said delay unit after inverting the phase thereof;
        an output signal from said delay interpolator is inputted into said delay interpolator as the not-delayed input signal after inverting the phase thereof; and
        an output signal from said delay unit is inputted into said delay interpolator as the delayed input signal.

2. A voltage controlled oscillating device according to claim 1 comprising:
    a current source for generating a specified current; and
    a current distributing circuit for distributing a current generated by said current source into a current path for passing a current through said delay unit or said delay interpolator and another current path at a ratio based on the first control signal.

3. A voltage controlling/oscillating device comprising:
    a first delay unit and a second delay unit in each of which a delay rate varies according to a first control signal, which delay units delay an input signal and outputs the delayed signal;
    a first delay interpolator in which a delay rate varies according to a first control signal, which delay interpolator synthesizes a first not-delayed input signal and a first delayed input signal at a synthesizing ratio based on a second control signal and outputs the synthesized signal; and
    a second delay interpolator in which a delay rate varies according to a first control signal, which delay interpolator synthesizes a second not-delayed input signal and a second delayed input signal at the synthesizing ratio based on the second control signal and outputs the synthesized signal; wherein
        an output signal from said second delay interpolator is inputted into said first delay unit after inverting the phase thereof;
        an output signal from said second delay interpolator is inputted into said first delay interpolator as the first not-delayed input signal after inverting the phase thereof;
        an output signal from said first delay unit is inputted into said first delay interpolator as the first delayed input signal;
        an output signal from said first delay interpolator is inputted into said second delay unit;
        an output signal from said first delay interpolator is inputted into said second delay interpolator as the second not-delayed input signal; and
        an output signal from said second delay unit is inputted into said second delay interpolator as the second delayed input signal.

4. A voltage controlled oscillating device according to claim 3 comprising:
    a current source for generating a specified current; and
    a current distributing circuit for distributing a current generated by said current source into a current path for passing a current through said delay unit or said delay interpolator and another current path at a ratio based on the first control signal.

5. A voltage controlled oscillating device comprising:
    a delay unit for delaying an input signal and outputting the delayed signal;
    a first delay interpolator for synthesizing a first not-delayed input signal and a first delayed input signal at a synthesizing ratio based on a first control signal and outputting the synthesized signal, said first control signal controlling oscillation frequency; and
    a second delay interpolator for synthesizing a second not-delayed input signal and a second delayed input signal at a synthesizing ratio based on a second control signal and outputting the synthesized signal, said second control signal controlling propagation delay rate; wherein
        an output signal from said first delay interpolator is inputted with the phase thereof inverted into said delay unit;
        an output signal from said first delay interpolator is inputted with the phase thereof inverted into said second delay interpolator as the second not-delayed input signal;

an output signal from said first delay interpolator is inputted with the phase thereof inverted into said first delay interpolator as the first not-delayed input signal;

an output signal from said delay unit is inputted into said second delay interpolator as the second delayed input signal; and an output signal from said second delay interpolator is inputted into said first delay interpolator as the first delayed input signal.

6. A voltage controlled oscillating device comprising:

a first delay unit and a second delay unit each for delaying an input signal and outputting the delayed signal;

a first delay interpolator for synthesizing a first not-delayed input signal and a first delayed input signal at a synthesizing ratio based on a first control signal and outputting the synthesized signal;

a second delay interpolator for synthesizing a second not-delayed input signal and a second delayed input signal at a synthesizing ratio based on a second control signal and outputting the synthesized signal;

a third delay interpolator for synthesizing a third not-delayed input signal and a third delayed input signal at the synthesizing ratio based on the first control signal and outputting the synthesized signal; and a fourth delay interpolator for synthesizing a fourth not-delayed input signal and a fourth delayed input signal at the synthesizing ratio based on the second control signal and outputting the synthesized signal; wherein an output signal from said third delay interpolator is inputted with the phase thereof inverted into said first delay unit;

an output signal from said third delay interpolator is inputted with the phase thereof inverted into said second delay interpolator as the second not-delayed input signal;

an output signal from said third delay interpolator is inputted with the phase thereof inverted into said first delay interpolator as the first not-delayed input signal;

an output signal from said first delay unit is inputted into said second delay interpolator as the second delayed input signal;

an output signal from said second delay interpolator is inputted into said first delay interpolator as the first delayed input signal;

an output signal from said first delay interpolator is inputted into said second delay unit;

an output signal from said first delay interpolator is inputted into said fourth delay interpolator as the fourth not-delayed input signal;

an output signal from said first delay interpolator is inputted into said third delay interpolator as the third not-delayed input signal;

an output signal from said second delay unit is inputted into said fourth delay interpolator as the fourth delayed input signal; and an output signal from said fourth delay interpolator is inputted into said third delay interpolator as the third delayed input signal.

7. A voltage controlled oscillating comprising:

a delay unit for delaying an input signal and outputting the delayed signal;

a first delay interpolator for synthesizing a first not-delayed input signal and a first delayed input signal at a synthesizing ratio based on a first control signal and outputting the synthesized signal, said first control signal controlling oscillation frequency; and a second delay interpolator for synthesizing a second not-delayed input signal and a second delayed input signal at a synthesizing ratio based on a second control signal and outputting the synthesized signal, said second control signal controlling propagation delay rate; wherein an output signal from said first delay interpolator is inputted with the phase thereof inverted into said delay unit;

an output signal from said first delay interpolator is inputted with the phase thereof inverted into said second delay interpolator as the second not-delayed input signal;

an output signal from said delay unit is inputted into said second delay interpolator as the second delayed input signal;

an output signal from said delay unit is inputted into said first delay interpolator as the first not-delayed input signal; and an output signal from said second delay interpolator is inputted into said first delay interpolator as the first delayed input signal.

8. A voltage controlled oscillating device comprising:

a first delay unit and a second delay unit each for delaying an input signal and outputting the delayed signal;

a first delay interpolator for synthesizing a first not-delayed input signal and a first delayed input signal at a synthesizing ratio based on a first control signal and outputting the synthesized signal;

a second delay interpolator for synthesizing a second not-delayed input signal and a second delayed input signal at a synthesizing ratio based on a second control signal and outputting the synthesized signal;

a third delay interpolator for synthesizing a third not-delayed input signal and a third delayed input signal at the synthesizing ratio based on the first control signal and outputting the synthesized signal; and a fourth delay interpolator for synthesizing a fourth not-delayed input signal and a fourth delayed input signal at the synthesizing ratio based on the second control signal and outputting the synthesized signal; wherein an output signal from said third delay interpolator is inputted with the phase thereof inverted into said first delay unit;

an output signal from said third delay interpolator is inputted with the phase thereof inverted into said second delay interpolator as the second not-delayed input signal;

an output signal from said first delay unit is inputted into said second delay interpolator as the second delayed input signal;

an output signal from said first delay unit is inputted into said first delay interpolator as the first not-delayed input signal;

an output signal from said second delay interpolator is inputted into said first delay interpolator as the first delayed input signal;

an output signal from said first delay interpolator is inputted into said second delay unit;

an output signal from said first delay interpolator is inputted into said fourth delay interpolator as the fourth not-delayed input signal;

an output signal from said second delay unit is inputted into said fourth delay interpolator as the fourth delayed input signal;

an output signal from said second delay unit is inputted into said third delay interpolator as the third not-delayed input signal; and an output signal from said fourth delay interpolator is inputted into said third delay interpolator as the third delayed input signal.

9. A voltage controlled oscillating device comprising:

a first delay unit for delaying an input signal and outputting a delayed signal;

a delay interpolator for receiving said delayed signal and outputting a synthesized signal to a first output terminal;

an inverter for inverting said synthesized signal from said delay interpolator and outputting an inverted signal to said first delay unit;

a first control signal for controlling an oscillation frequency; and a second control signal for controlling a propagation delay rate, wherein said first control signal and said second control signal control the oscillation frequency and propagation delay rate of said synthesized signal, respectively.

10. The voltage controlled oscillating device according to claim 9, wherein said delay interpolator is a first delay interpolator that outputs a first synthesized signal, and said inverted signal is inputted into said first delay interpolator.

11. The voltage controlled oscillating device according to claim 10, wherein said first control signal is inputted into said first delay interpolator, and said second control signal is inputted into said first delay unit and said first delay interpolator.

12. The voltage controlled oscillating device according to claim 10, further comprising:

a second delay unit for delaying said first synthesized signal from said first delay interpolator and outputting a second delayed signal;

a second delay interpolator for receiving said second delayed signal and outputting said synthesized signal to said first output terminal; and a second output terminal for outputting said first synthesized signal from said first delay interpolator, wherein said first control signal is inputted into said first delay interpolator and said second delay interpolator, and said second control signal is inputted into said first delay unit, said second delay unit, said first delay interpolator, and said second delay interpolator.

13. The voltage controlled oscillating device according to claim 10, further comprising:

a second delay interpolator for receiving said first synthesized signal and outputting said synthesized signal to said first output terminal, wherein said first control signal is inputted into said second delay interpolator and said second control signal is inputted into said first delay interpolator.

14. The voltage controlled oscillating device according to claim 13, wherein said inverted signal from said inverter is inputted into said second delay interpolator.

15. The voltage controlled oscillating device according to claim 13, wherein said first delayed signal from said first delay unit is inputted into said second delay interpolator.

16. The voltage controlled oscillating device according to claim 9, wherein said delay interpolator is a first delay interpolator that outputs a first synthesized signal, and said voltage controlled oscillating device further comprising:

a second delay interpolator for receiving said inverted signal and outputting a second synthesized signal, said second synthesized signal being received by said first delay interpolator;

a second delay unit for receiving said first synthesized signal and outputting a second delayed signal;

a third delay interpolator for outputting a third synthesized signal to said first output terminal;

a fourth delay interpolator for receiving said first synthesized signal and said second delayed signal and outputting a fourth synthesized signal, said fourth synthesized signal being received by said third delay interpolator; and a second output terminal for receiving said first synthesized signal, wherein said first control signal is inputted into said first delay interpolator and said third delay interpolator, and said second control signal is inputted into said second delay interpolator and said fourth delay interpolator.

17. The voltage controlled oscillating device according to claim 16, wherein said inverted signal from said inverter is inputted into said first delay interpolator, and said first synthesized signal from said first delay interpolator is inputted into said third delay interpolator.

18. The voltage controlled oscillating device according to claim 16, wherein said fist delayed signal from said first delay unit is inputted into said first delay interpolator, and said second delayed signal from said second delay unit is inputted into said third delay interpolator.

* * * * *